(12) United States Patent
Mori

(10) Patent No.: US 10,388,741 B2
(45) Date of Patent: Aug. 20, 2019

(54) SEMICONDUCTOR DEVICE WITH ARRANGEMENT OF SEMICONDUCTOR REGIONS FOR IMPROVING BREAKDOWN VOLTAGES

(71) Applicant: Renesas Electronics Corporation, Koutou-ku, Tokyo (JP)

(72) Inventor: Takahiro Mori, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/411,987

(22) Filed: Jan. 21, 2017

(65) Prior Publication Data

US 2017/0250259 A1 Aug. 31, 2017

(30) Foreign Application Priority Data

Feb. 25, 2016 (JP) .................................. 2016-034151

(51) Int. Cl.
*H01L 29/06* (2006.01)
*H01L 29/08* (2006.01)
(Continued)

(52) U.S. Cl.
CPC ...... *H01L 29/408* (2013.01); *H01L 21/26513* (2013.01); *H01L 29/0696* (2013.01);
(Continued)

(58) Field of Classification Search
None
See application file for complete search history.

(56) References Cited

U.S. PATENT DOCUMENTS

2002/0050619 A1* 5/2002 Kawaguchi ........... H01L 27/088
257/368
2004/0084744 A1 5/2004 Khemka et al.
(Continued)

FOREIGN PATENT DOCUMENTS

JP 2006-505136 A 2/2006
JP 2011-003608 A 1/2011
(Continued)

OTHER PUBLICATIONS

Extended European Search Report dated Jun. 13, 2017, in European Patent Application No. 17158016.0.
(Continued)

*Primary Examiner* — Fazli Erdem
*Assistant Examiner* — Scott R Wilson
(74) *Attorney, Agent, or Firm* — Shapiro, Gabor and Rosenberger, PLLC

(57) ABSTRACT

A first p type semiconductor region is provided between an n type drift region surrounding a drain region and an n type buried region, and a second p type semiconductor region is provided between the first p type semiconductor region and a p type well region surrounding a source region so as to overlap the first p type semiconductor region and the p type well region. Negative input breakdown voltage can be ensured by providing the first p type semiconductor region over the n type buried region. Further, potential difference between the source region and the first p type semiconductor region can be increased and the hole extraction can be performed quickly. Also, a path of hole current flowing via the second p type semiconductor region can be ensured by providing the second p type semiconductor region. Thus, the on-breakdown voltage can be improved.

19 Claims, 31 Drawing Sheets

(51) Int. Cl.
*H01L 29/10* (2006.01)
*H01L 29/40* (2006.01)
*H01L 29/66* (2006.01)
*H01L 29/78* (2006.01)
*H01L 21/265* (2006.01)

(52) U.S. Cl.
CPC ...... *H01L 29/0869* (2013.01); *H01L 29/0886* (2013.01); *H01L 29/1083* (2013.01); *H01L 29/1095* (2013.01); *H01L 29/401* (2013.01); *H01L 29/66659* (2013.01); *H01L 29/66681* (2013.01); *H01L 29/7816* (2013.01); *H01L 29/7835* (2013.01); *H01L 29/0653* (2013.01); *H01L 29/0692* (2013.01); *H01L 29/1045* (2013.01)

(56) References Cited

U.S. PATENT DOCUMENTS

| | | | |
|---|---|---|---|
| 2008/0164537 A1* | 7/2008 | Cai | H01L 29/0847 257/408 |
| 2008/0191277 A1 | 8/2008 | Disney et al. | |
| 2010/0314683 A1* | 12/2010 | Yanagi | H01L 27/0635 257/339 |
| 2013/0134510 A1* | 5/2013 | Yanagi | H01L 29/7816 257/337 |
| 2015/0171211 A1 | 6/2015 | Zhang et al. | |
| 2015/0380398 A1* | 12/2015 | Mallikarjunaswamy | H01L 29/7823 257/272 |

FOREIGN PATENT DOCUMENTS

| | | |
|---|---|---|
| JP | 2011-514675 A | 5/2011 |
| JP | 2013-115166 A | 6/2013 |

OTHER PUBLICATIONS

Office Action, dated Jun. 11, 2019, in Japanese Application No. 2016-034151.

\* cited by examiner

W/Finger

W/Finger

PISO dose[cm⁻²]

PISO dose[cm⁻²]

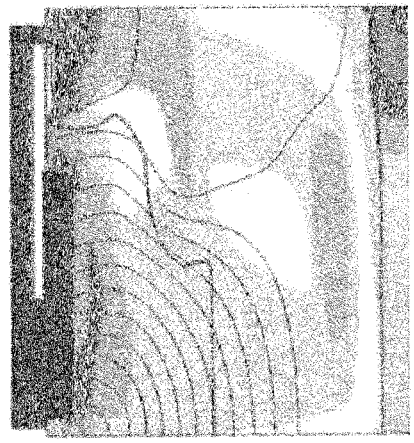
FIG. 13A
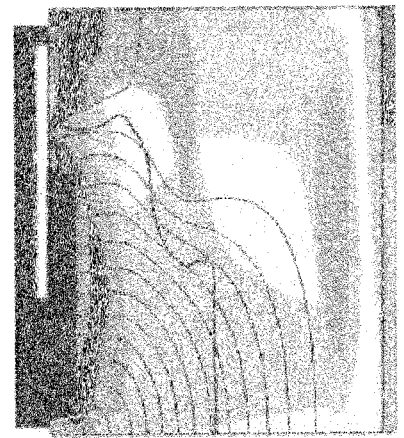
FIG. 13B
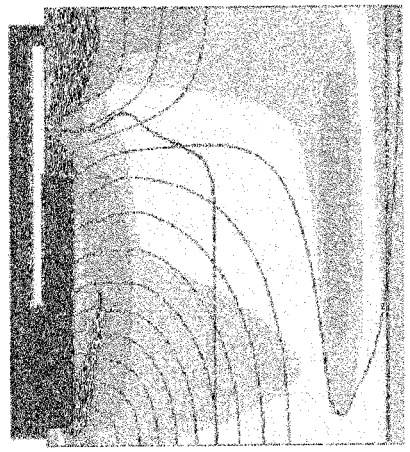
FIG. 13C
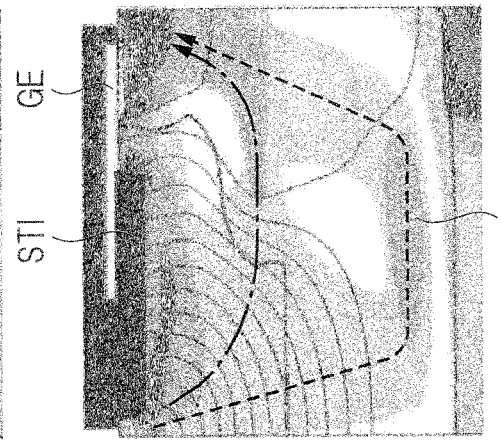
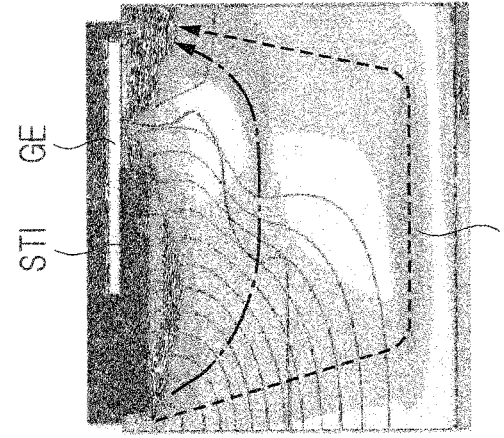
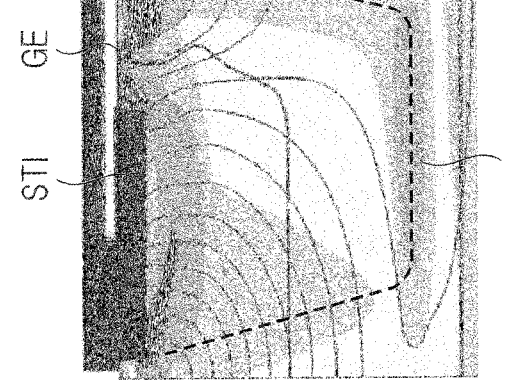

FIG. 14A
FIG. 14B
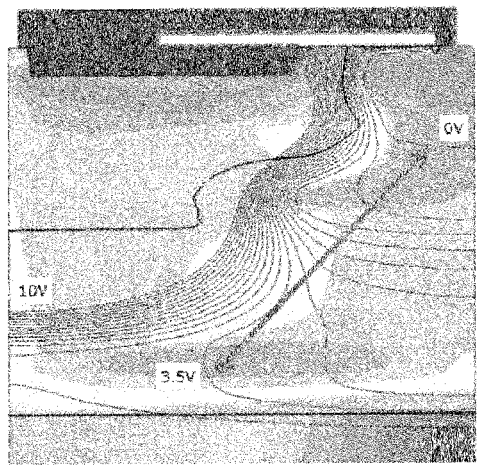
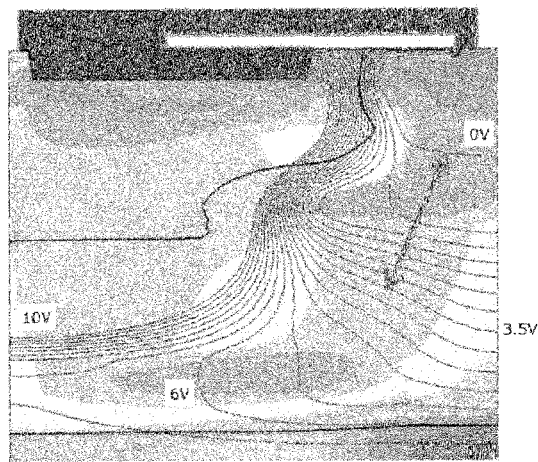
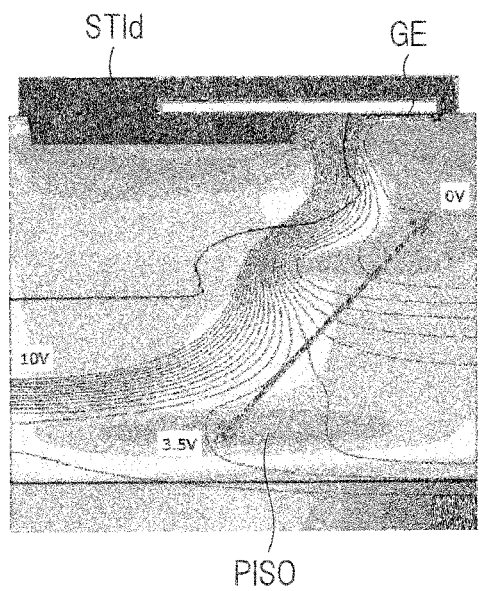
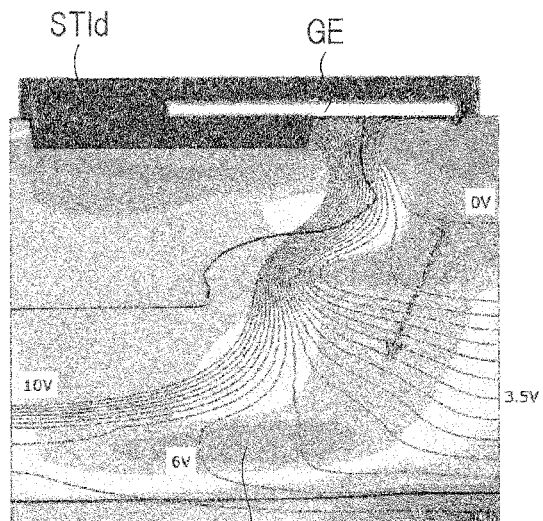

SEMICONDUCTOR DEVICE WITH ARRANGEMENT OF SEMICONDUCTOR REGIONS FOR IMPROVING BREAKDOWN VOLTAGES

CROSS-REFERENCE TO RELATED APPLICATION

The present application claims priority from Japanese Patent Application No. 2016-034151 filed on Feb. 25, 2016, the content of which is hereby incorporated by reference into this application.

TECHNICAL FIELD OF THE INVENTION

The present invention relates to a semiconductor device and a manufacturing method of a semiconductor device, and can be effectively used for, for example, a semiconductor device having an LDMOS transistor.

BACKGROUND OF THE INVENTION

A reduced surface field (RESURF) MOS transistor is adopted for a laterally diffused metal-oxide-semiconductor field effect transistor (LDMOSFET, LDMOS transistor or LDMISFET, simply referred to as "LDMOS" hereinafter). A structure in which a thick oxide film is formed on a front surface of a semiconductor substrate and a drain-side edge of a gate electrode is arranged on the oxide film, thereby reducing the field intensity below the drain-side edge of the gate electrode has been studied.

For example, Japanese Unexamined Patent Application Publication No. 2011-003608 (Patent Document 1) discloses an LDMOS transistor in which a $p^+$ buried region having a p type impurity concentration higher than that of a $p^-$ epitaxial region is formed between an $n^+$ buried region and the $p^-$ epitaxial region.

Also, Japanese Unexamined Patent Application Publication No. 2011-514675 (Patent Document 2) discloses an N channel LDMOS formed in an isolated P type region. This N channel LDMOS includes an $N^+$ drain region, a gate, a gate oxide film, an $N^+$ source region and a $P^+$ body contact region. Then, a deep P type region is arranged below the source region.

In addition, Japanese Unexamined Patent Application Publication No. 2006-505136 (Patent Document 3) discloses a RESURF transistor including an electrically floating semiconductor region above a semiconductor substrate and a P type body region and an N type drift region located above the electrically floating semiconductor region. Then, when a reverse bias is applied, a semiconductor region between the N type drift region and the electrically floating semiconductor region is depleted.

SUMMARY OF THE INVENTION

In the course of the study of the LDMOS, the inventor of the present invention has found that there is room for improvement in the structure of the LDMOS.

For example, in the LDMOS transistor described in the Patent Document 1 (Japanese Unexamined Patent Application Publication No. 2011-003608), the on-breakdown voltage tends to be decreased along with the increase of the gate width. Also, in the transistor structure described in the Patent Document 3 (Japanese Unexamined Patent Application Publication No. 2006-505136), it is not possible to obtain sufficient negative input breakdown voltage.

Consequently, it is desired to study the structure of LDMOS capable of improving the on-breakdown voltage and the negative input breakdown voltage.

The other problems and novel characteristics of the present invention will be apparent from the description of the present specification and the accompanying drawings.

The following is a brief description of an outline of the typical embodiment disclosed in the present application.

A semiconductor device described in one embodiment disclosed in the present application is an LDMOS including: a first semiconductor region of a first conductivity type surrounding a drain region; and a second semiconductor region of a second conductivity type surrounding a source region. The semiconductor device further includes: a third semiconductor region of the second conductivity type below the first semiconductor region; and a fourth semiconductor region of the second conductivity type arranged between the third semiconductor region and the second semiconductor region so as to overlap the third semiconductor region and the second semiconductor region.

According to the semiconductor device described in the following typical embodiment disclosed in the present application, it is possible to improve the characteristics of the semiconductor device.

According to the manufacturing method of a semiconductor device described in the following typical embodiment disclosed in the present application, it is possible to manufacture a semiconductor device having good characteristics.

BRIEF DESCRIPTIONS OF THE DRAWINGS

FIG. 13A is a drawing showing a simulation result of hole current intensity;

FIG. 13B is a drawing showing a simulation result of hole current intensity;

FIG. 13C is a drawing showing a simulation result of hole current intensity;

FIG. 14A is a drawing showing a simulation result of electric potential;

FIG. 14B is a drawing showing a simulation result of electric potential;

DESCRIPTIONS OF THE PREFERRED EMBODIMENTS

Figure 1:
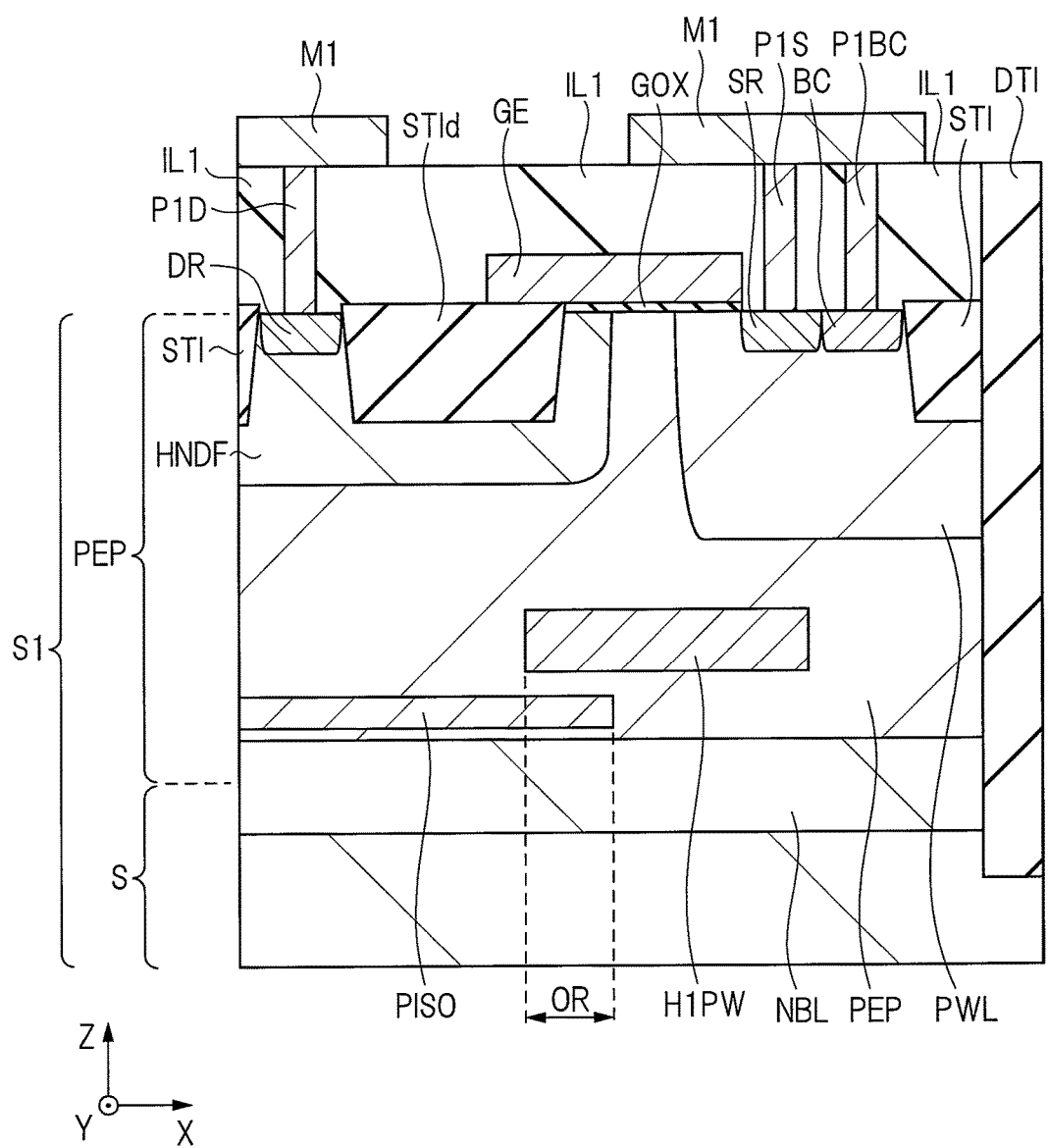
FIG. 1 is a cross-sectional view showing a structure of a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or apart of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the number of elements (including number of pieces, values, amount, range, and the like).

Hereinafter, embodiments of the present invention will be described in detail with reference to the accompanying drawings. Note that components having the same function are denoted by the same reference characters throughout the drawings for describing the embodiments, and the repetitive description thereof will be omitted. Also, when there are a plurality of similar members (portions), an individual or specific portion is indicated by adding a symbol to a generic character in some cases. In addition, the description of the same or similar portions is not repeated in principle in the following embodiments.

In addition, in some drawings used in the following embodiments, hatching is omitted even in a cross-sectional view so as to make the drawings easy to see. Also, hatching is used even in a plan view so as to make the drawings easy to see.

Further, the size of respective portions does not correspond to that of an actual device in sectional views and plan views, and a specific portion is shown in a relatively enlarged manner in some cases so as to make the drawings easy to see. Also, portions a plan view and a cross-sectional view may be shown in different sizes even when the plan view and the cross-sectional view correspond to each other.

(First Embodiment)

Hereinafter, a semiconductor device of a present embodiment will be described in detail with reference to drawings.

[Description of Structure]

Figure 2:
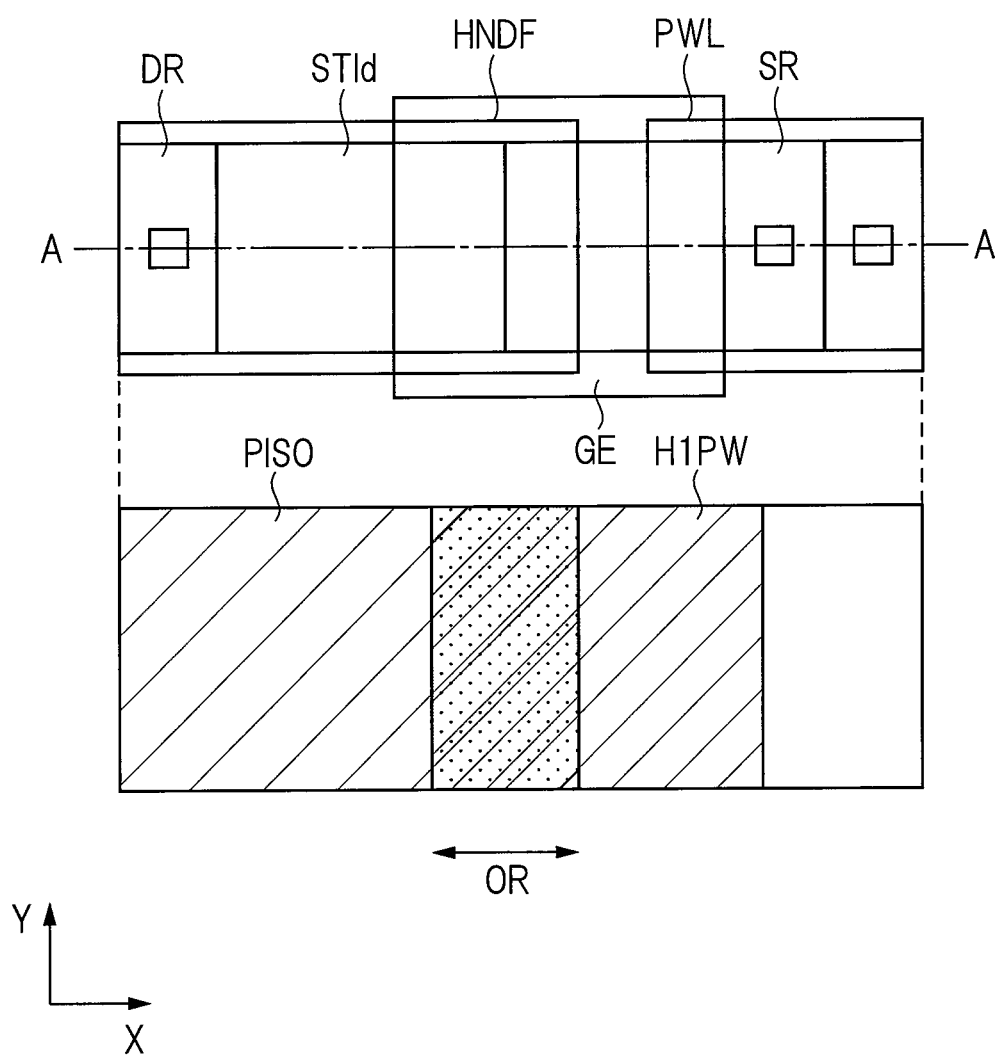
FIG. 2 is a schematic plan view showing the structure of the semiconductor device according to the first embodiment.

FIG. 1 is a cross-sectional view showing a structure of the semiconductor device according to the present embodiment, and FIG. 2 is a schematic plan view showing the structure of the semiconductor device according to the present embodiment. FIG. 1 corresponds to a cross section taken along the line A-A in FIG. 2, for example. An upper view of FIG. 2 primarily shows a planar layout of a main surface of a p$^-$ type epitaxial layer PEP, and a lower view of FIG. 2 shows a planar layout of semiconductor regions in a lower part of the p$^-$ type epitaxial layer PEP.

The semiconductor device shown in FIG. 1 and FIG. 2 is a semiconductor device including an n channel LDMOS transistor. Note that the LDMOS transistor is referred to as a lateral power MOSFET in some cases.

Figure 16:
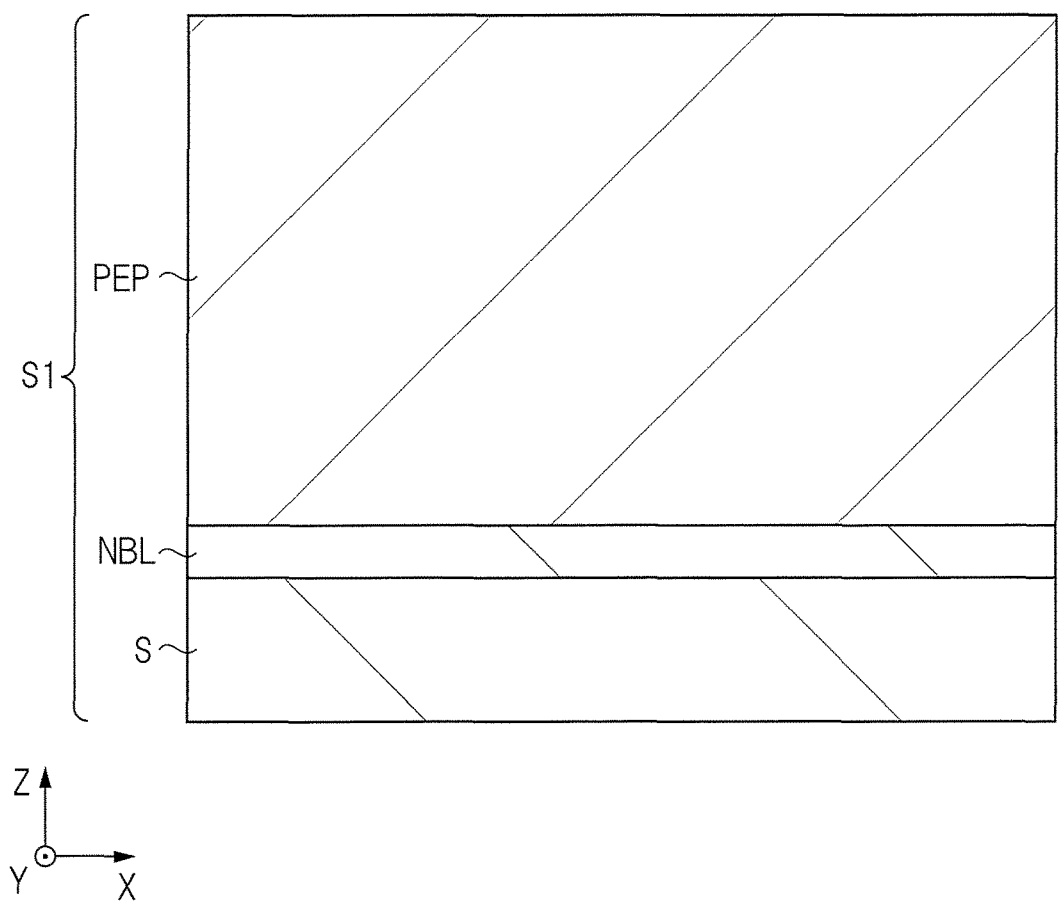
FIG. 16 is a cross-sectional view showing the manufacturing process of the semiconductor device according to the first embodiment.

The semiconductor device according to the present embodiment is formed on a semiconductor substrate S1 in which a p⁻ type epitaxial layer (semiconductor layer) PEP is formed on a support substrate S (see FIG. 16). An n type buried region (n type semiconductor region) NBL is formed in the vicinity of the boundary between the support substrate S and the p⁻ type epitaxial layer PEP. Alternatively, the semiconductor device may be formed on the main surface of the substrate made of semiconductor by omitting the p⁻ type epitaxial layer PEP.

The semiconductor device shown in FIG. 1 includes a gate electrode GE formed over the semiconductor substrate S1 (p⁻ type epitaxial layer PEP) via a gate insulting film GOX and a source region SR and a drain region DR formed on both sides of the gate electrode GE (right and left sides of paper in FIG. 1 and FIG. 2).

The source region SR is formed in a p type well region (p type semiconductor region, p type body region) PWL. In other words, the p type well region PWL is formed so as to surround the source region SR. The p type well region PWL has an impurity concentration higher than that of the p⁻ type epitaxial layer PEP. Further, the drain region DR is formed in an n type drift region (n type semiconductor region) HNDF. In other words, the n type drift region HNDF is formed so as to surround the drain region DR. The n type drift region HNDF has an impurity concentration lower than that of the drain region DR. In addition, a drain insulating region (field drain region) STId is formed in the n type drift region HNDF.

Then, the p type semiconductor region (PEP, PWL) between the source region (n⁺ type semiconductor region, n type impurity region, n type diffusion region) SR and the drain region (n⁺ type semiconductor region, n type impurity region, n type diffusion region) DR serves as a channel formation region. By providing the n type drift region HNDF and the drain insulating region STId between the channel formation region and the drain region DR, an electric field at an end part of the gate electrode GE on a side closer to the drain region DR can be reduced (field plate effect). Thus, it is possible to increase the breakdown voltage of the LDMOS.

In the present embodiment, a p type semiconductor region (p type junction isolation portion) PISO is provided between the n type drift region HNDF and the n type buried region NBL. Furthermore, a p type semiconductor region H1PW is provided between the p type semiconductor region PISO and the p type well region PWL. The p type semiconductor region H1PW is located at a position shallower than the p type semiconductor region PISO, and the p type semiconductor region H1PW and the p type semiconductor region PISO are arranged so as to partially overlap each other in a plan view. An overlapping region between the p type semiconductor region H1PW and the p type semiconductor region PISO is denoted by "OR". Also, the p type semiconductor region H1PW is located at a position deeper than the p type well region PWL, and the p type semiconductor region H1PW and the p type well region PWL are arranged so as to partially overlap each other in a plan view.

By providing the p type semiconductor region PISO over the n type buried region NBL in this manner, the negative input breakdown voltage can be ensured.

Furthermore, in the present embodiment, in the transistor operation with a high drain voltage, a path of a hole current flowing through the p type semiconductor region PISO can be shortened by providing the p type semiconductor region PISO only below the n type drift region HNDF. In addition, the potential difference between the source region SR and the p type semiconductor region PISO can be increased. Due to these effects, the holes can be extracted quickly. Also, by providing the p type semiconductor region H1PW, a path of a hole current flowing through the p type semiconductor region H1PW can be ensured. Thus, it is possible to improve the on-breakdown voltage.

Figure 3:
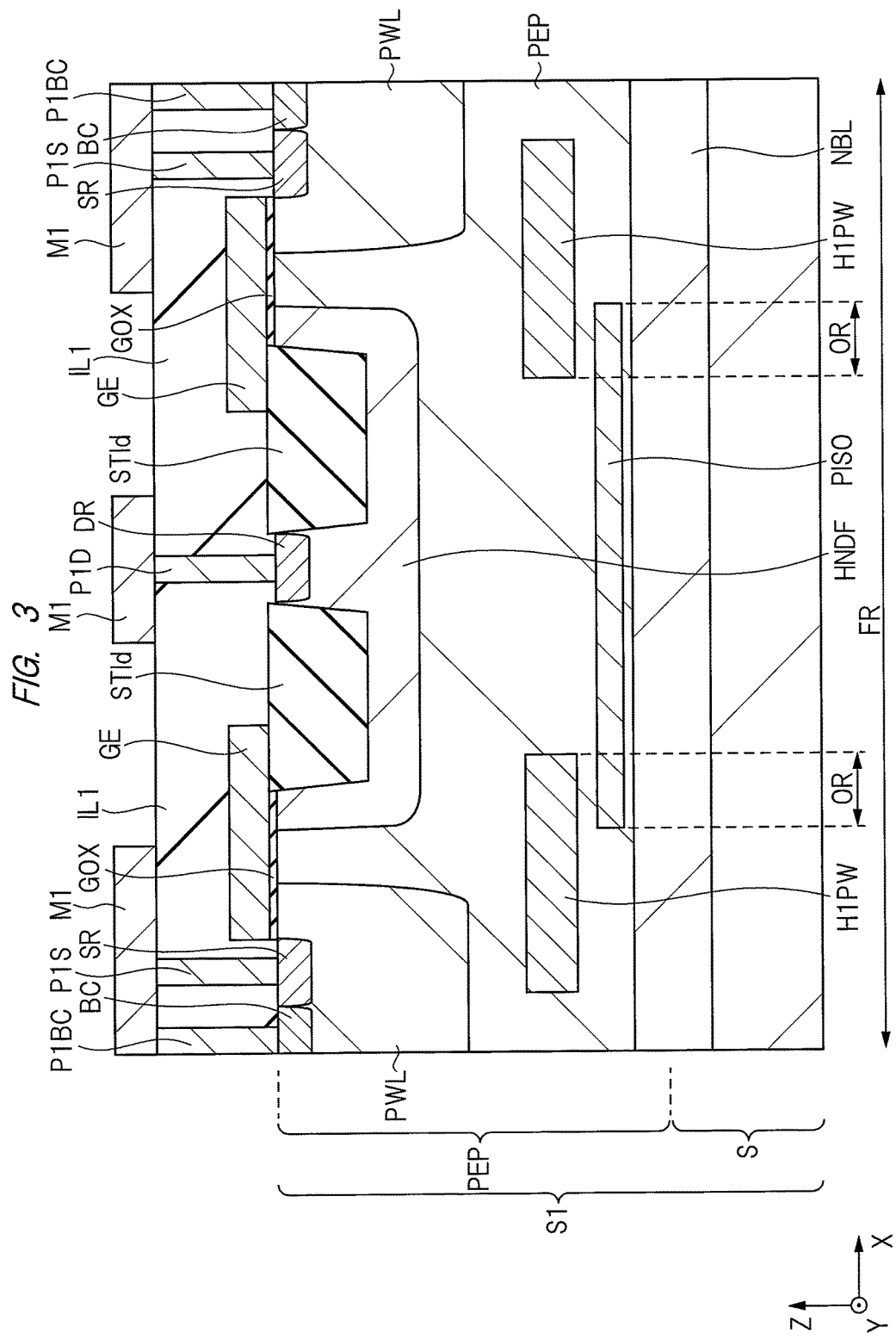
FIG. 3 is a cross-sectional view showing another structure of the semiconductor device according to the first embodiment.
Figure 4:
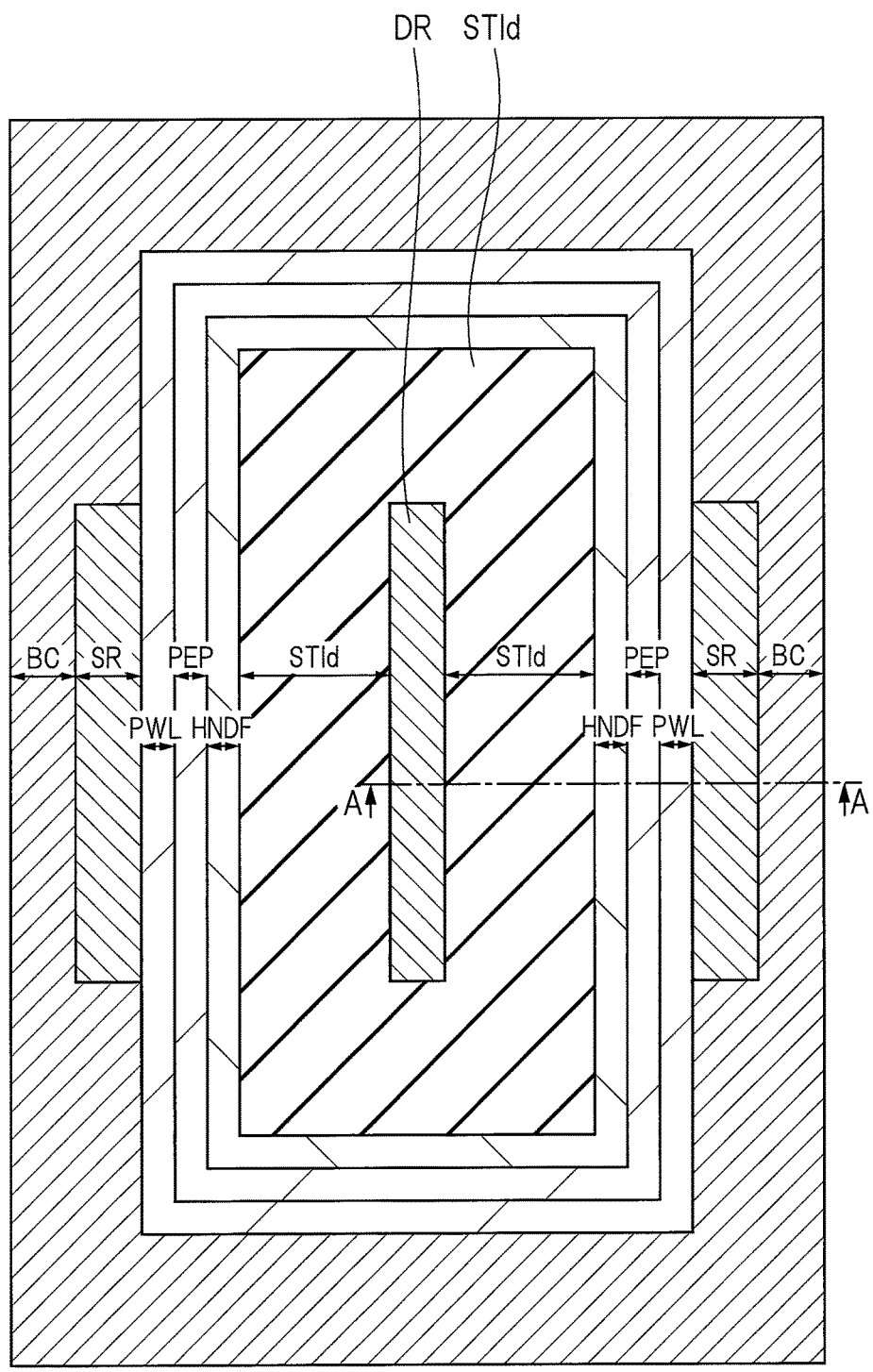
FIG. 4 is a plan view showing the structure of the semiconductor device in FIG. 3 according to the first embodiment.
Figure 5:
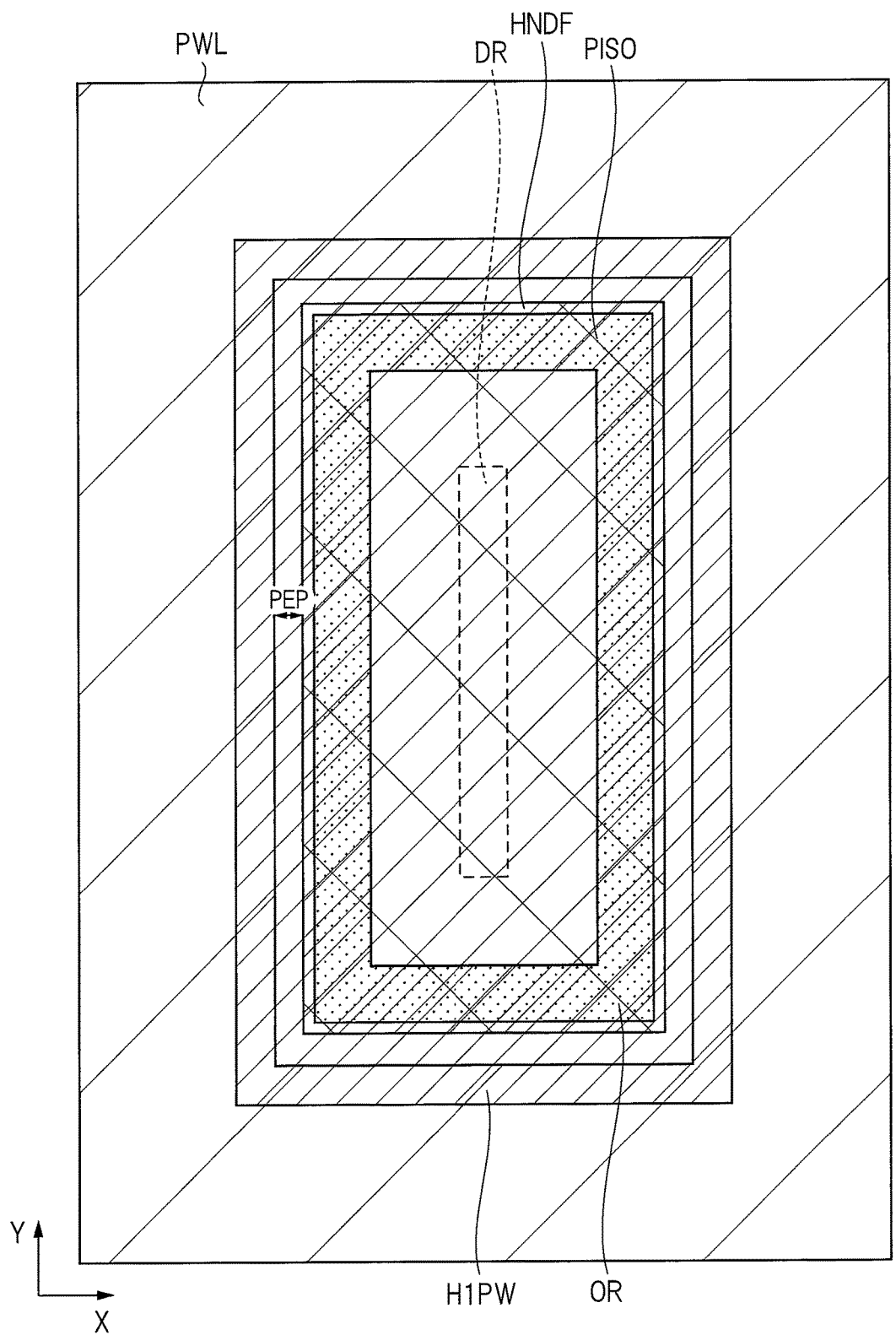
FIG. 5 is a plan view showing the structure of the semiconductor device in FIG. 3 according to the first embodiment.
Figure 6:
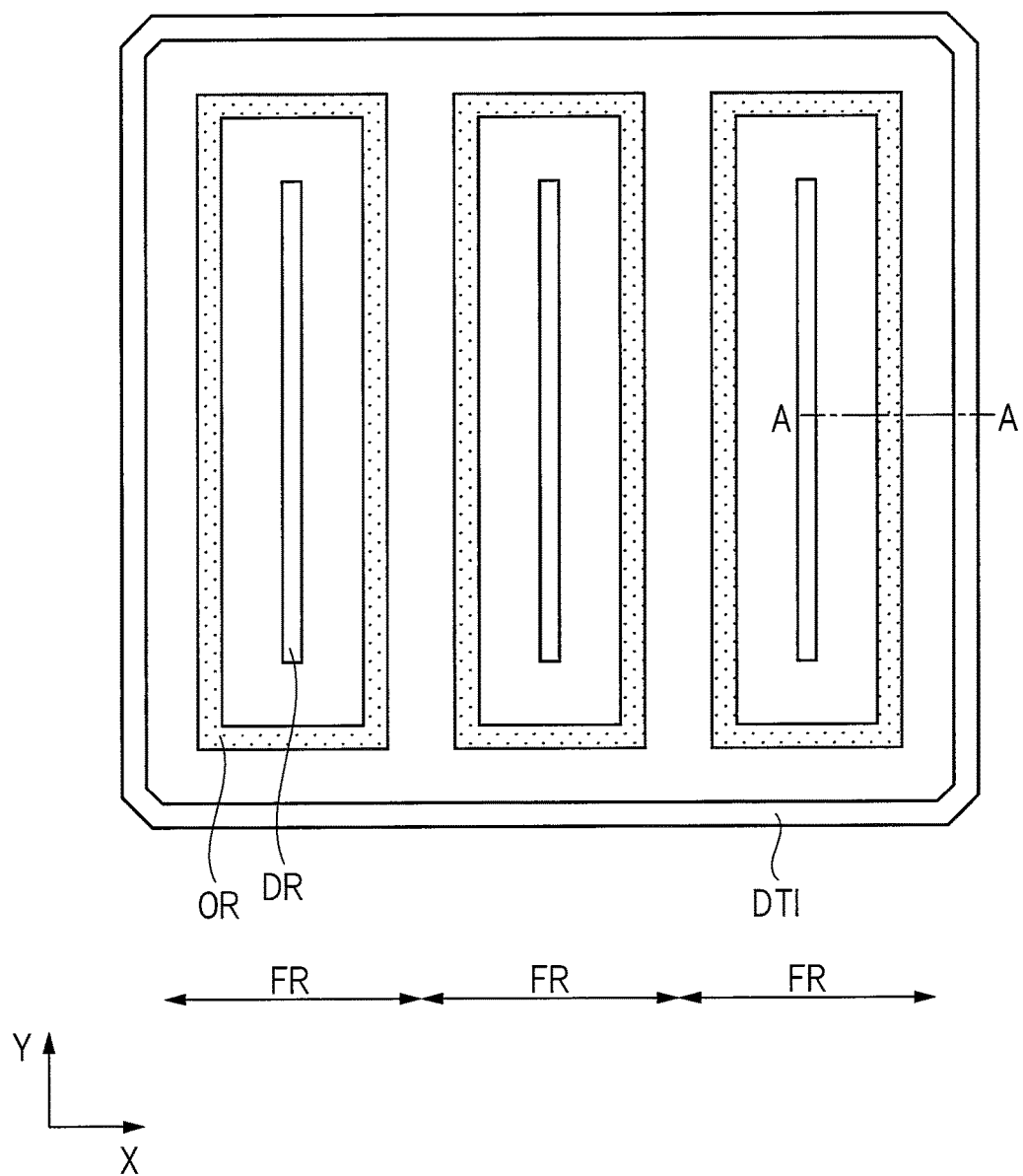
FIG. 6 is a plan view showing a manufacturing process of the semiconductor device according to the first embodiment.

FIG. 3 to FIG. 6 are a cross-sectional view and plan views showing another structure of the semiconductor device according to the present embodiment. FIG. 3 to FIG. 5 show the semiconductor device in which the source region SR, the drain region DR and the gate electrode GE are arranged to be symmetrical with respect to the drain region DR. FIG. 3 corresponds to a cross section taken along a line A-A and an extended line thereof in FIG. 4, for example. FIG. 4 primarily shows a planar layout of constituent parts in an upper part of the p⁻ type epitaxial layer PEP, and FIG. 5 shows a planar layout of the n type drift region HNDF, the p type semiconductor region PISO, the p type well region PWL and the p type semiconductor region H1PW.

In the semiconductor device shown in FIG. 3, the constituent parts shown in FIG. 1 are arranged to be symmetrical with respect to the drain region DR, and thus the parts corresponding to those of FIG. 1 are denoted by the same reference characters and the descriptions thereof are omitted. FIG. 4 and FIG. 5 each shows an example of the planar layout of the respective constituent parts shown in FIG. 3. As shown in FIG. 4, the source regions SR are arranged inside an annular rectangular body contact region BC. Then, an annular rectangular exposed surface of the p type well region PWL is arranged inside the source regions SR. An annular rectangular exposed surface of the p⁻ type epitaxial layer PEP is arranged inside the annular rectangular p type well region PWL. An annular rectangular exposed surface of the n type drift region HNDF is arranged inside the annular rectangular exposed surface of the p⁻ type epitaxial layer PEP. The annular rectangular drain insulating region STId is arranged inside the annular rectangular n type drift region HNDF. Note that the drain region DR is arranged inside the annular rectangular drain insulating region STId. Namely, the drain region DR is arranged to form a rectangular shape extending in a Y direction at the center of the rectangular drain insulating region STId. In addition, as shown in FIG. 5, the n type drift region HNDF is arranged to form a rectangular shape in a plan view, and the p type well region PWL is arranged to form an annular rectangular shape surrounding the n type drift region HNDF. In addition, the p type semiconductor region PISO is arranged to form a rectangular shape below the n type drift region HNDF, and the p type semiconductor region H1PW is arranged to form an annular rectangular shape between the p type semiconductor region PISO and the p type well region PWL so as to partially overlap the p type semiconductor region PISO and the p type well region PWL. The overlapping region OR (shaded region in FIG. 5) between the p type semiconductor region PISO and the p type semiconductor region H1PW is arranged to form an annular rectangular shape. Note that the gate electrode GE is arranged to form an annular rectangular shape between the source region SR and the drain region DR.

As described above, respective constituent parts are arranged annularly around the drain region DR (FIG. 4, FIG. 5). The region surrounded by the annular rectangular body contact region BC around the drain region DR shown in FIG. 4 is defined as one unit, and is referred to as a finger region (cell region) FR. For example, in the plan view shown in FIG. 6, three finger regions FR are arranged in an X direction. Then, a deep insulating region DTI (see FIG. 1) is arranged so as to surround the three finger regions FR arranged in the X direction. By surrounding the finger region FR by the deep insulating region DTI in this manner, the elements (LDMOS) can be electrically separated from other elements. Note that FIG. 1 corresponds also to a cross section taken along the line A-A in FIG. 6.

The same signal (potential) is applied to the gate electrodes GE, the source regions SR and the drain regions DR of the three finger regions FR, and the three finger regions FR surrounded by the deep insulating region DTI form a single element (LDMOS). The drain insulating region STId, an insulating region STI and the deep insulating region DTI are made of an insulating film buried in isolation trenches. The deep insulating region DTI is made of an insulating film buried in an isolation trench deeper than the drain insulating region STId. Note that the number of finger regions FR within the region surrounded by the deep insulating region DTI is not particularly limited. The number of finger regions FR is referred to as "finger count".

Figure 7:
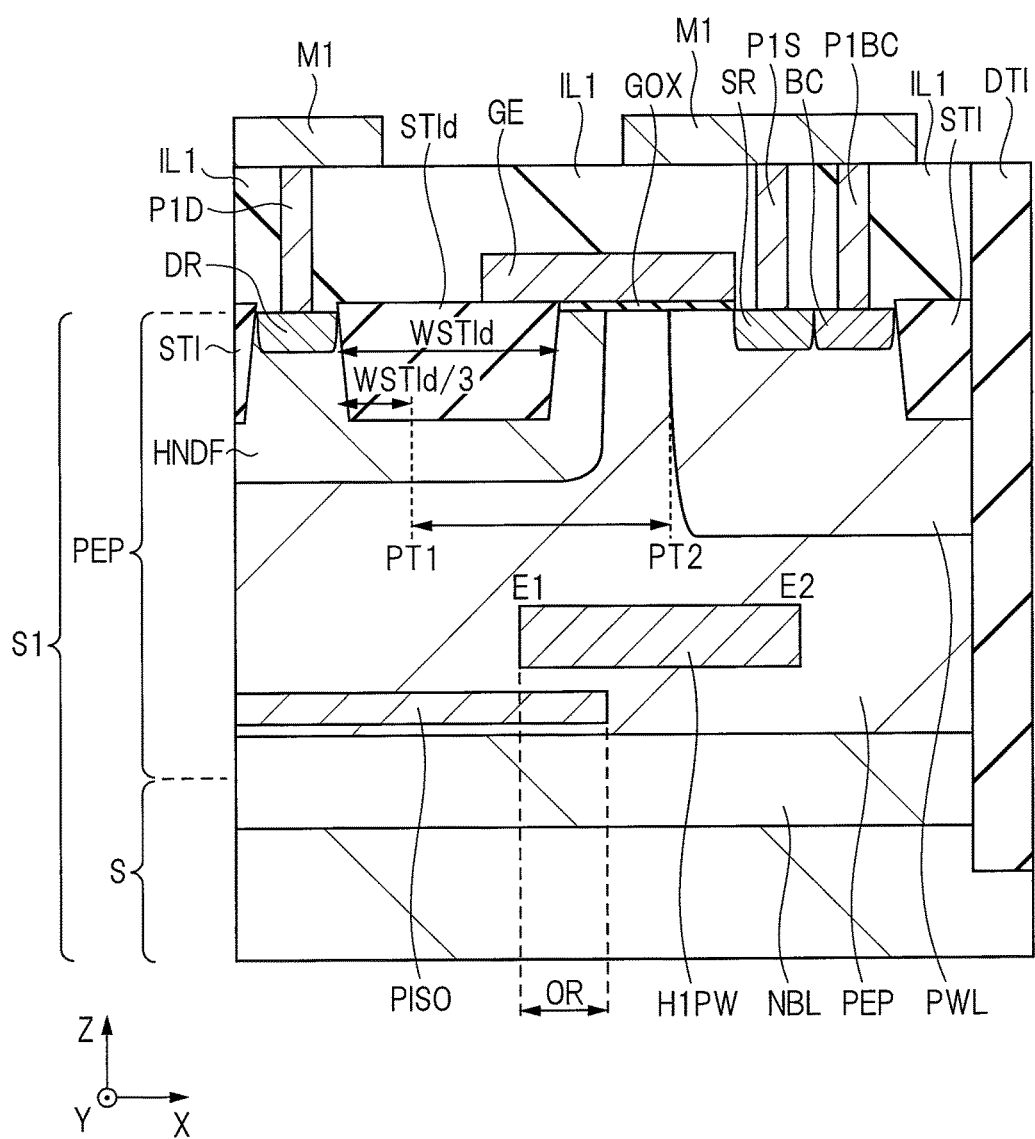
FIG. 7 is a cross-sectional view showing positions of a left end and a right end of a p type semiconductor region H1PW.

Next, positions of a left end and a right end of the p type semiconductor region H1PW will be described. FIG. 7 is a cross-sectional view showing positions of a left end and a right end of the p type semiconductor region H1PW.

A left end E1 of the p type semiconductor region H1PW is preferably located between a position below the drain insulating region STId and a position below the p type well region PWL. In particular, the left end E1 of the p type semiconductor region H1PW is more preferably located between a point PT1 and a point PT2 described below. The point PT1 is a point distant from an end of the drain region DR on a side closer to the drain insulating region STId (right end) by one-third of a width WSTId of the drain insulating region STId. The point PT2 is a point (position) corresponding to an end of the p type well region PWL on a side closer to the drain insulating region STId (left end). Since on-breakdown voltage and off-breakdown voltage may be reduced when the left end E1 of the p type semiconductor region H1PW is too close to the drain region DR, it is preferable to separate them by about one-third of the width WSTId described above. In addition, since off-breakdown voltage may be reduced when the left end E1 of the p type semiconductor region H1PW is too far from the n type drift region HNDF, it is preferable that the left end E1 is arranged on an inner side relative to the end of the p type well region PWL on a side closer to the drain insulating region STId. Further, by arranging the left end E1 of the p type semiconductor region H1PW on an inner side relative to the end of the p type well region PWL on a side closer to the drain insulating region STId, a path of holes through the p type semiconductor region H1PW is created as described later, and thus the reduction of on-breakdown voltage can be suppressed.

A right end E2 of the p type semiconductor region H1PW is preferably arranged on a side of the deep insulating region DTI relative to the point PT2. By arranging the right end E2 in this manner, the p type semiconductor region H1PW and the p type well region PWL overlap each other, and the resistance between the p type semiconductor region PISO and the p type well region PWL can be reduced.

Figure 8:
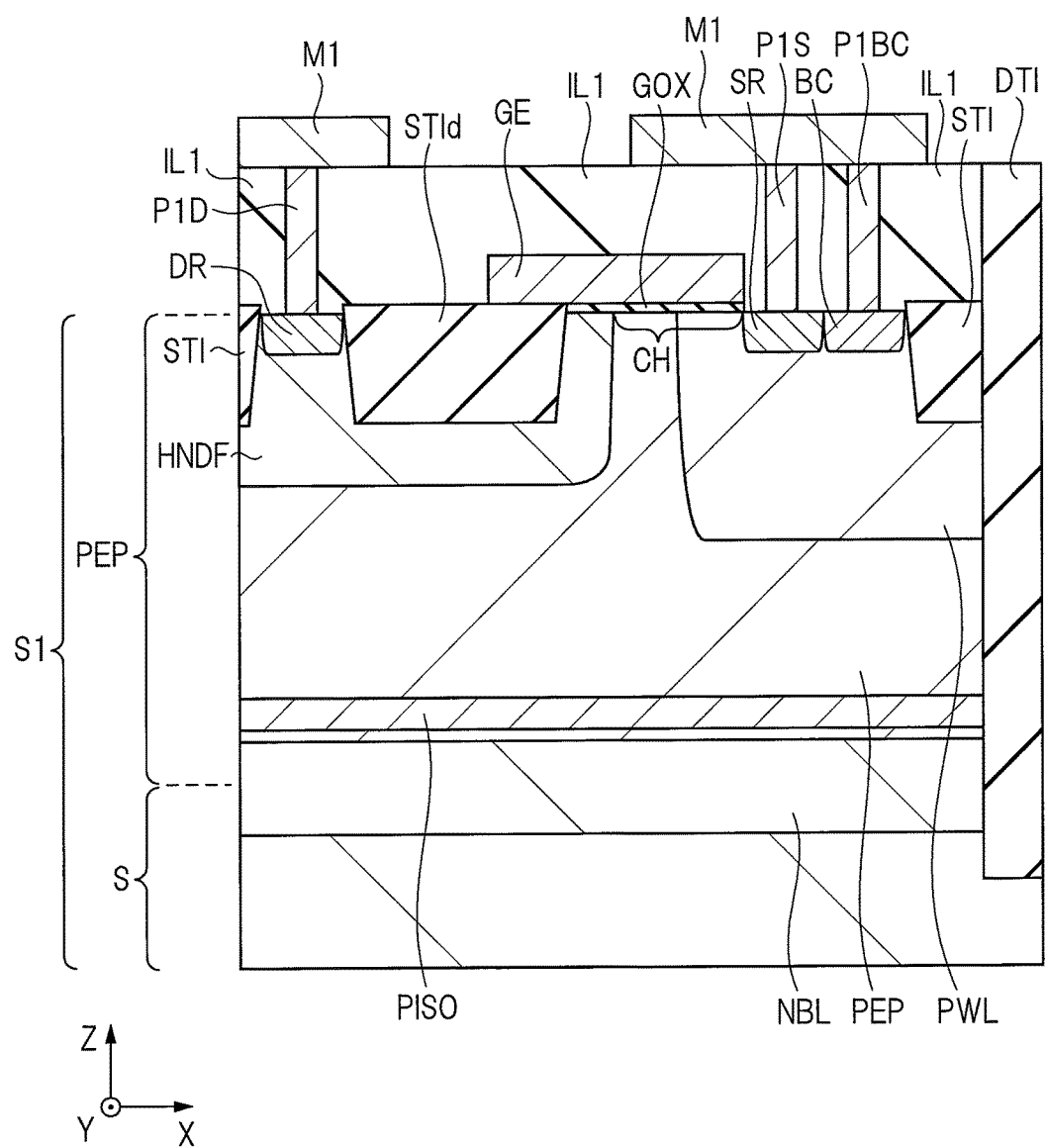
FIG. 8 is a cross-sectional view showing a structure of a semiconductor device according to a first comparative example.

FIG. 8 is a cross-sectional view showing a structure of a semiconductor device according to a first comparative example. In the first comparative example shown in FIG. 8, the p type semiconductor region H1PW is not formed between the p type well region PWL and the p type semiconductor region PISO. Also, the p type semiconductor region PISO extends to the deep insulating region DTI.

As described above, the p type semiconductor region PISO is provided over the n type buried region NBL in order to ensure the negative input breakdown voltage. In the structure of the first comparative example, however, the on-breakdown voltage is reduced when the gate width of the transistor and the finger count are increased. The gate width is a length of the gate electrode GE in the Y direction shown in FIG. 2.

(Consideration)

It is considered that the reduction of on-breakdown voltage is due to the following phenomenon. That is, in the semiconductor device of the first comparative example, when potential is applied to the gate electrode GE to be in an ON state and high potential (high voltage) is applied to the drain region DR, holes generated by the high impact ionization in the vicinity of the drain region DR pass through the p type semiconductor region PISO to the source region SR and a back gate (semiconductor region below the gate electrode GE (CH)). Due to the movement of holes through the long path like this, the potential difference is likely to occur between the source region SR and the back gate. When the potential difference becomes equal to or higher than VF potential (forward drop potential of NP junction part), a snap-back operation occurs and the on-breakdown voltage is reduced. In particular, when the gate width and the finger count are increased, the potential difference between the source region SR and the back gate is likely to become higher than the VF potential even at a low drain potential, and the on-breakdown voltage is reduced.

On the other hand, in the present embodiment, a path of holes through the p type semiconductor region H1PW is also created in addition to the path of holes through the p type semiconductor region PISO, and it is thus possible to suppress the reduction of the on-breakdown voltage. Furthermore, since the p type semiconductor region PISO is shorter in the present embodiment than that in the first comparative example, the path of holes through the p type semiconductor region PISO is shortened. In other words, it is possible to reduce the resistance of the p type semiconductor region PISO. This also makes it possible to suppress the reduction of the on-breakdown voltage.

In addition, by shortening the path of holes through the p type semiconductor region PISO, the effect to increase the potential difference between the p type semiconductor region PISO and the source region SR or between the p type semiconductor region PISO and the back gate can be achieved, and this allows the holes to easily pass to the source region SR and the back gate. This also makes it possible to suppress the reduction of the on-breakdown voltage.

(Verification)

Figure 9A:
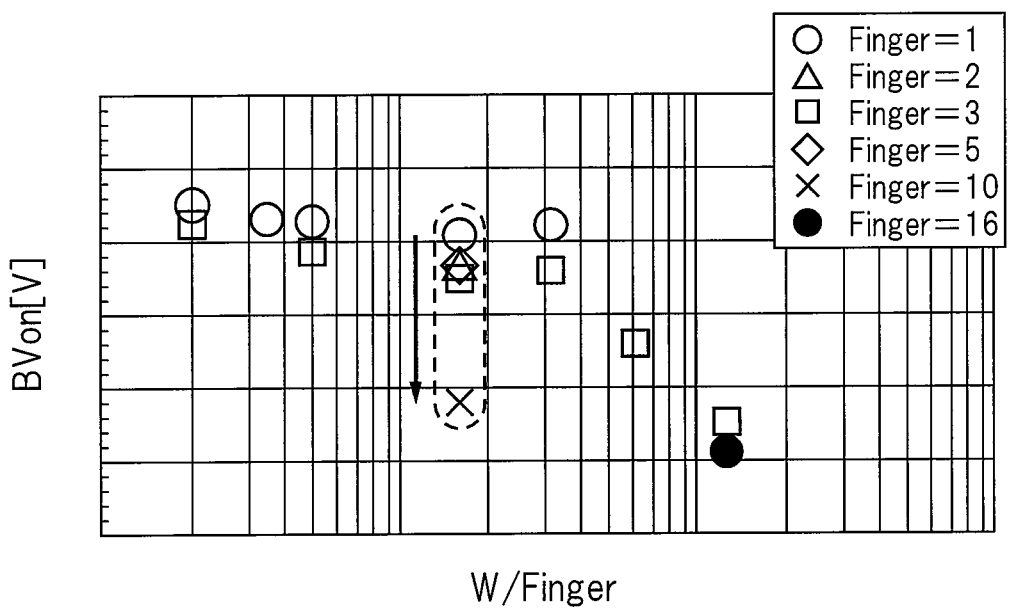
FIG. 9A is a graph showing a relationship between on-breakdown voltage and a gate width.
Figure 9B:
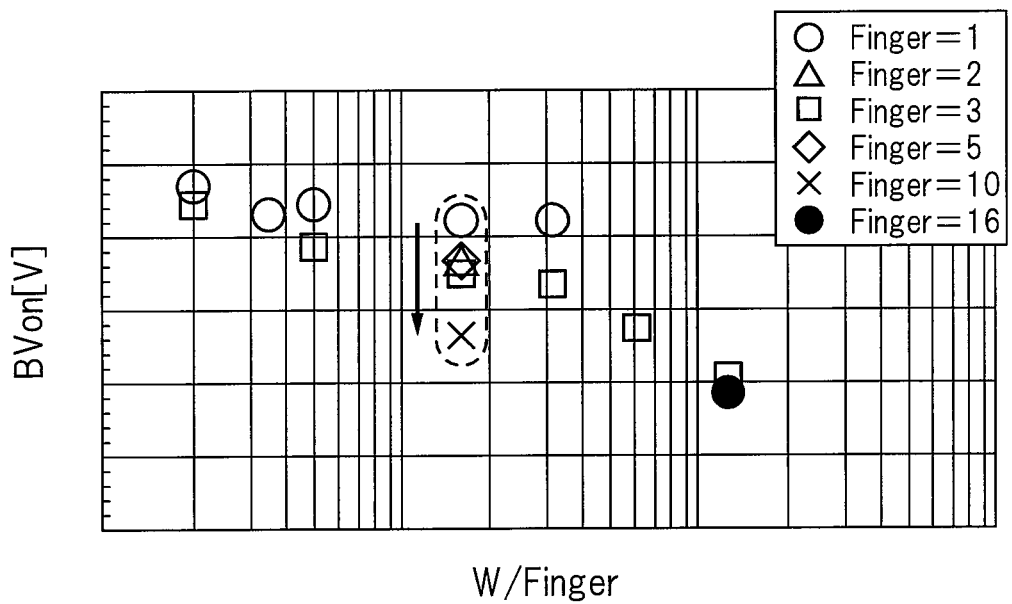
FIG. 9B is a graph showing a relationship between on-breakdown voltage and a gate width.

FIG. 9A and FIG. 9B are graphs each showing a relationship between on-breakdown voltage and a gate width. FIG. 9A corresponds to the case of the first comparative example, and FIG. 9B corresponds to the case of the present embodiment. The vertical axis of each graph represents the on-breakdown voltage (V) and the horizontal axis represents gate width/finger count. Note that the gate-source potential (Vgs) is set to 4.0 V, and FIG. 9A and FIG. 9B have the same graph scale.

As shown in FIG. 9A, for example, when focusing on a plot enclosed by a broken line, the on-breakdown voltage is reduced as the finger count increases. Also in FIG. 9B, the on-breakdown voltage is reduced as the finger count increases. However, it can be understood that the reduction rate of the on-breakdown voltage is smaller in the case of FIG. 9B because FIG. 9A and FIG. 9B have the same graph scale. As described above, the reduction of the on-breakdown voltage can be reduced in the case of the present embodiment shown in FIG. 9B in comparison with the case of the first comparative example shown in FIG. 9A.

Figure 10A:
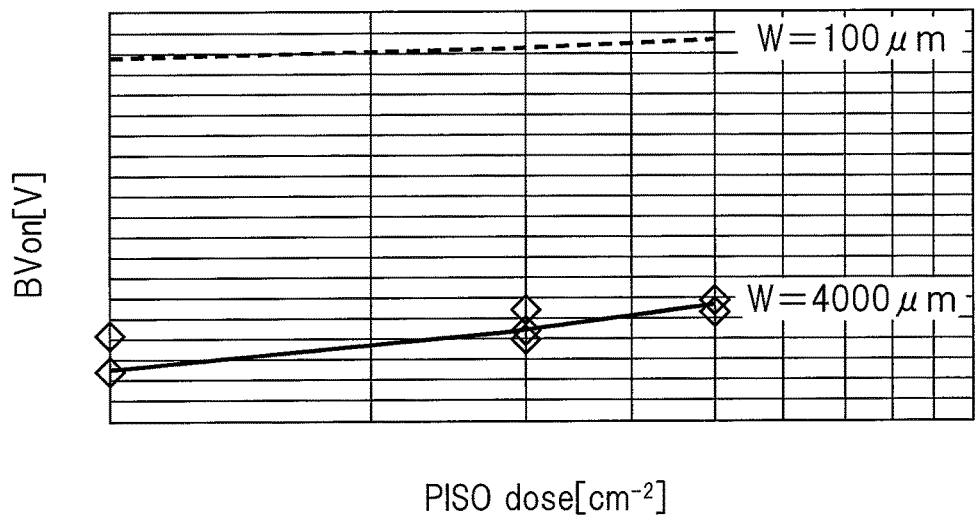
FIG. 10A is a graph showing a relationship between on-breakdown voltage and dose amount of a p type semiconductor region PISO.
Figure 10B:
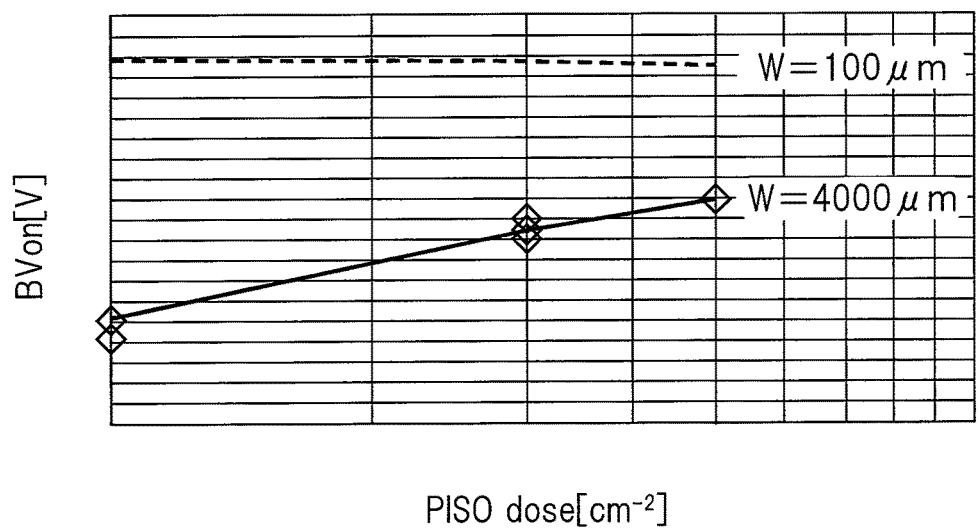
FIG. 10B is a graph showing a relationship between on-breakdown voltage and dose amount of the p type semiconductor region PISO.

FIG. 10A and FIG. 10B are graphs each showing a relationship between on-breakdown voltage and dose amount of the p type semiconductor region PISO. FIG. 10A corresponds to the case of the first comparative example, and FIG. 10B corresponds to the case of the present embodiment. The case where the gate width (W) is 100 µm and the case where the gate width (W) is 4000 µm have been examined. The vertical axis of each graph represents the on-breakdown voltage (V) and the horizontal axis represents the dose amount (cm$^{-2}$) of the p type semiconductor region PISO. Note that the gate-source potential (Vgs) is set to 4.0 V.

As is apparent from the comparison between FIG. 10A and FIG. 10B, when the gate width (W) is small, for example, about 100 µm, the on-breakdown voltage can be maintained in both the case of the first comparative example shown in FIG. 10A and the case of the present embodiment shown in FIG. 10B. Meanwhile, when the gate width (W) is large, for example, about 4000 µm, the on-breakdown voltage is reduced in both the case of the first comparative example shown in FIG. 10A and the case of the present embodiment shown in FIG. 10B. However, the on-breakdown voltage is higher as the dose amount of the p type semiconductor region PISO becomes larger, and the on-breakdown voltage higher than the case of the first comparative example shown in FIG. 10A can be maintained in the case of the present embodiment shown in FIG. 10B. Note that, in the case of the first comparative example shown in FIG. 10A, the degree of improvement of the on-breakdown voltage is small even when the dose amount of the p type semiconductor region PISO is increased. This is probably because the resistance from the p type semiconductor region PISO to the p type well region PWL is high.

As described above, the effect of suppressing the reduction of the on-breakdown voltage of the semiconductor device according to the present embodiment has been clarified from FIGS. 9A and 9B and FIGS. 10A and 10B.

Here, since the p type semiconductor region PISO over the n type buried region NBL is provided only below the n type drift region HNDF in the present embodiment, the p type semiconductor region PISO is shorter than that in the first comparative example (FIG. 8). Thus, there is concern about whether or not the negative input breakdown voltage can be ensured even in the case where the p type semiconductor region PISO is short as described above.

The negative input breakdown voltage can be ensured by partially overlapping the p type semiconductor region H1PW and the p type semiconductor region PISO.

Figure 11:
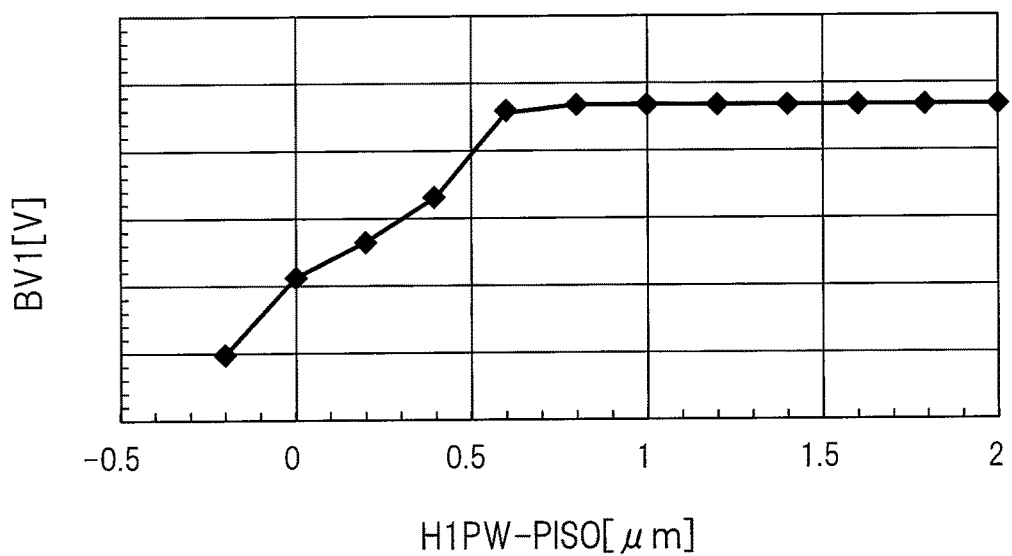
FIG. 11 is a graph showing a relationship between overlapping amount of the p type semiconductor region H1PW and the p type semiconductor region PISO and negative input breakdown voltage.

FIG. 11 is a graph showing a relationship between overlapping amount of the p type semiconductor region H1PW and the p type semiconductor region PISO and negative input breakdown voltage. The horizontal axis represents the overlapping amount of the p type semiconductor region H1PW and the p type semiconductor region PISO (H1PW-PISO, width of OR, length of OR in x direction, µm), and the vertical axis represents the negative input breakdown voltage (BV1, V). The negative input breakdown voltage means the breakdown voltage in the case where the potential of each of the source region SR, the drain region DR and the gate electrode GE becomes lower than the potential of the semiconductor substrate S1. For example, the breakdown voltage in the case where the potential of each of the source region SR, the drain region DR and the gate electrode GE is set to 0 V and the potential of the semiconductor substrate S1 is raised toward the positive (+) side is examined.

As shown in FIG. 11, when the overlapping amount of the p type semiconductor region H1PW and the p type semiconductor region PISO is about 0.6 µm, the negative input breakdown voltage becomes maximum and remains at the same level thereafter. Thus, it has been confirmed that the negative input breakdown voltage can be ensured by partially overlapping the p type semiconductor region H1PW and the p type semiconductor region PISO.

Furthermore, in order to clarify the effect of the present embodiment, a device simulation has been carried out using technology CAD (TCAD). FIGS. 12A to 12C, 13A to 13C and 14A and 14B show the results of the device simulation. In each drawing, the simulation results are shown in the upper drawings, and signs and the like are additionally placed in the lower drawings so as to make the simulation results easily understood.

Figure 27:
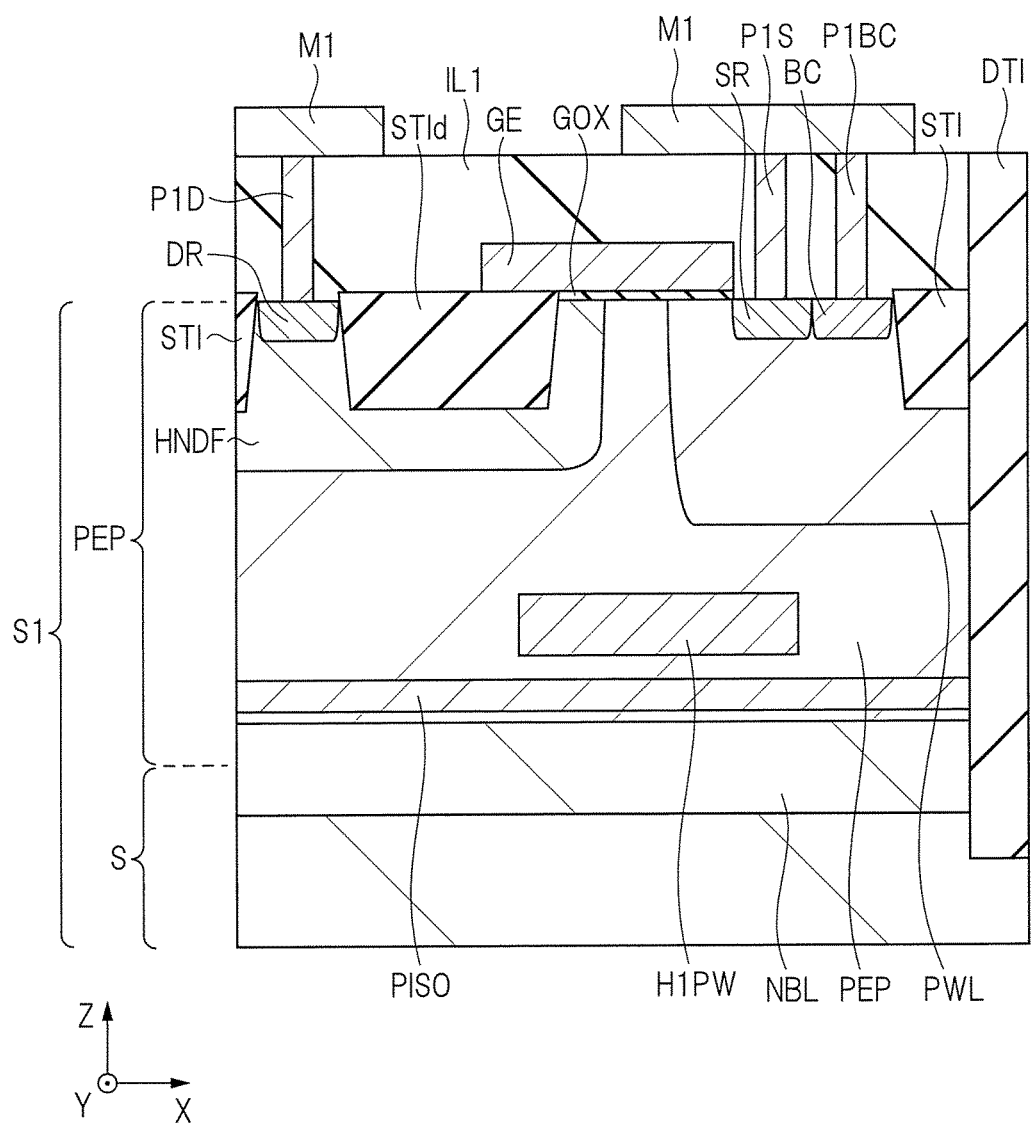
FIG. 27 is a cross-sectional view showing a structure of a semiconductor device of a first application example according to a second embodiment.

Note that the semiconductor device according to the second embodiment described later (FIG. 27) and the semiconductor device according to the first comparative example described above have also been examined in TCAD in addition to the semiconductor device according to the present embodiment (FIG. 1). In the description here, the semiconductor device according to the present embodiment shown in FIG. 1 is referred to as a first example, and the semiconductor device according to the second embodiment shown in FIG. 27 is referred to as a second example. In the case of the second example, the p type semiconductor region H1PW is formed over the long p type semiconductor region PISO similar to that of the first comparative example (see FIG. 27). In addition, the maximum gate potential (Vg) is set to 4.0 V and the drain potential (Vd) is set to 70 V in the TCAD.

Figure 12C:
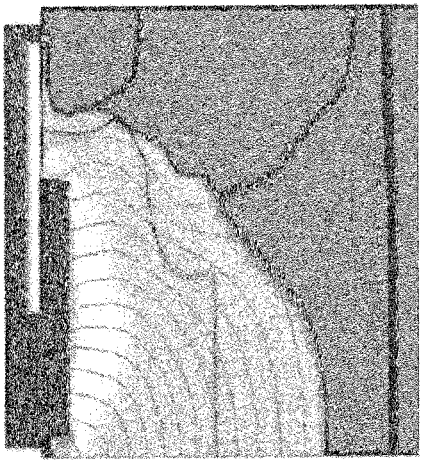
FIG. 12C is a drawing showing a simulation result of impact ionization.
Figure 12B:
FIG. 12B is a drawing showing a simulation result of impact ionization.
Figure 12A:
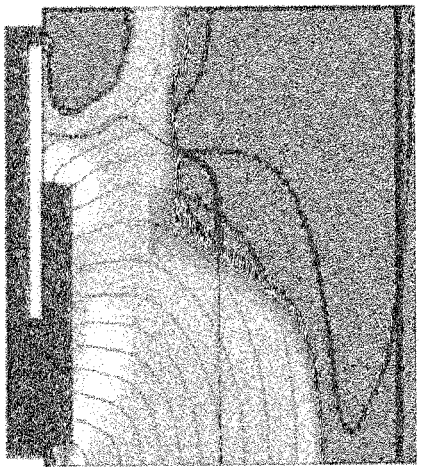
FIG. 12A is a drawing showing a simulation result of impact ionization.
Figure 12C:
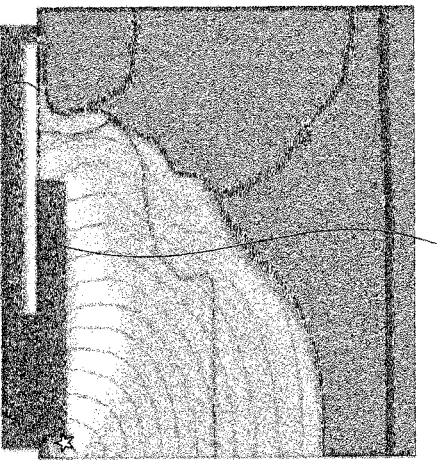
Figure 12B:
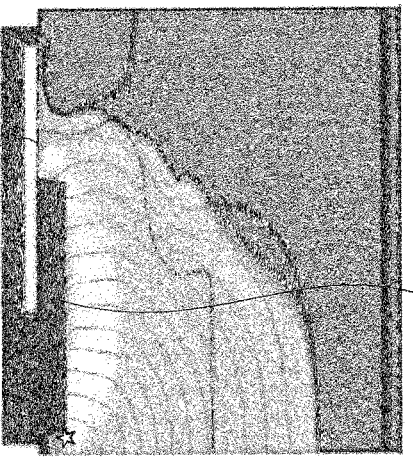
Figure 12A:

FIG. 12A to FIG. 12C are drawings each showing a simulation result of impact ionization and electrostatic potential (Line contour). FIG. 12A corresponds to the case of the first comparative example, FIG. 12B corresponds to the case of the second example, and FIG. 12C corresponds to the case of the first example (present embodiment).

As shown in FIGS. 12A to 12C, the impact ionization has occurred most at the end of the drain region DR in any cases of FIGS. 12A to 12C (see asterisks). It can be understood that the impact ionization has occurred most at the end of the drain region DR regardless of the structure.

FIGS. 13A to 13C are drawings each showing a simulation result of hole current intensity. FIG. 13A corresponds to the case of the first comparative example, FIG. 13B corresponds to the case of the second example, and FIG. 13C corresponds to the case of the first example (present embodiment). Note that black lines indicate potential distribution.

The holes generated by the impact ionization described with reference to FIGS. 12A to 12C flow through the p type semiconductor region PISO to the source region SR and the back gate as shown in FIGS. 13A to 13C (see arrows of dotted line). In the case of the first comparative example shown in FIG. 13A and the case of the second example shown in FIG. 13B, most of the holes flow to the source region SR and the back gate through the relatively long p type semiconductor region PISO. On the other hand, the p type semiconductor region PISO is short in the case of the first example (present embodiment) shown in FIG. 13C, and it can be understood that the path of holes through the p type semiconductor region PISO can be shortened. In addition, in the cases of FIG. 13B and FIG. 13C, the path through the p type semiconductor region H1PW is present (see arrows of one-dot chain line) in addition to the path through the p type semiconductor region PISO.

FIG. 14A and FIG. 14B are drawings each showing a simulation result of electrostatic potential. FIG. 14A corresponds to the case of the second example, and FIG. 14B corresponds to the case of the first example (present embodiment). As shown in FIGS. 14A and 14B, the potential difference between the p type semiconductor region PISO and the p type well region PWL becomes larger in the case of the first example shown in FIG. 14B in which the p type semiconductor region PISO is partially arranged than in the second example shown in FIG. 14A in which the long p type semiconductor region PISO is entirely arranged. Therefore, the holes can be extracted more quickly in the first example (present embodiment).

In this manner, matters examined in the section of "consideration" described above have been corroborated by the "verification" described above.

As described above, in the present embodiment, the p type semiconductor region PISO is provided over the n type buried region NBL, and the p type semiconductor region H1PW is provided so as to overlap the p type semiconductor region PISO, so that the on-breakdown voltage can be improved while maintaining the negative input breakdown voltage. In particular, even when the gate width of the transistor and the finger count are increased, the reduction of the on-breakdown voltage can be suppressed while maintaining the negative input breakdown voltage.

Hereinafter, the structure of the semiconductor device according to the present embodiment will be described in more detail.

As shown in FIG. 1 and others, the source region SR is formed in the p type well region (p type semiconductor region) PWL. The p type well region PWL has an impurity concentration higher than that of the p⁻ type epitaxial layer PEP. The region in which the p type well region PWL and the p⁻ type epitaxial layer PEP overlap each other serves as the channel formation region (CH). Also, the drain region DR is formed in the n type drift region (n type semiconductor region) HNDF. The drain insulating region STId is formed in the n type drift region HNDF.

The above-mentioned semiconductor regions (PWL, HNDF, SR, DR, BC) are formed in the region (active region) surrounded by the insulating regions (STI, DTI). The insulating region STI and the drain insulating region STId are made of an insulating film buried in the trenches formed in the semiconductor substrate S1 (p⁻ type epitaxial layer PEP). The deep insulating region DTI is made of an insulating film buried in a trench formed in an interlayer insulating film IL1 and the semiconductor substrate S1 (p⁻ type epitaxial layer PEP).

Note that the p⁺ type body contact region BC is formed adjacent to the source region SR in the p type well region PWL. Accordingly, the source region SR and the p⁺ type body contact region BC have the same potential.

In addition, the p type semiconductor region (p type junction isolation portion) PISO is formed between the n type drift region HNDF and the n type buried region NBL. The p type semiconductor region H1PW is formed between the p type semiconductor region PISO and the p type well region PWL. In other words, the p type semiconductor region H1PW is formed at the position deeper than the p type well region PWL and shallower than the p type semiconductor region PISO. Also, the p type semiconductor region H1PW is formed so as to partially overlap the p type semiconductor region PISO in a plan view, and the p type semiconductor region H1PW is formed so as to partially overlap the p type well region PWL.

In addition, a source plug P1S and a body contact plug P1BC are formed on the source region SR and the p⁺ type body contact region BC, respectively, and a drain plug P1D is formed on the drain region DR. In addition, though not illustrated in the cross section in FIG. 1, a gate plug is formed on the gate electrode GE. These plugs P1 (source plug P1S, body contact plug P1BC, drain plug P1D, gate plug) are formed in the interlayer insulating film IL1. Further, a wiring M1 is formed on the plug P1 and the interlayer insulating film IL1.

The gate electrode GE is formed via the gate insulating film GOX on the channel formation region and the drain insulating region STId so as to extend therebetween.

Note that FIG. 1 shows one set of the constituent parts including the source region SR, the drain region DR and the gate electrode GE, and these constituent parts are arranged to be symmetrical to form the finger region FR described above (see FIG. 3 and FIG. 4). In addition, a single element (LDMOS) in which a plurality of the finger regions FR are surrounded by the deep insulating region DTI is formed in some cases.

[Description of Manufacturing Method]

Next, a manufacturing method of the semiconductor device according to the present embodiment will be described and the structure of the semiconductor device will be more clarified with reference to FIG. 15 to FIG. 26. FIG. 15 to FIG. 26 are a plan view and cross-sectional views showing the manufacturing process of the semiconductor device according to the present embodiment.

Figure 15:
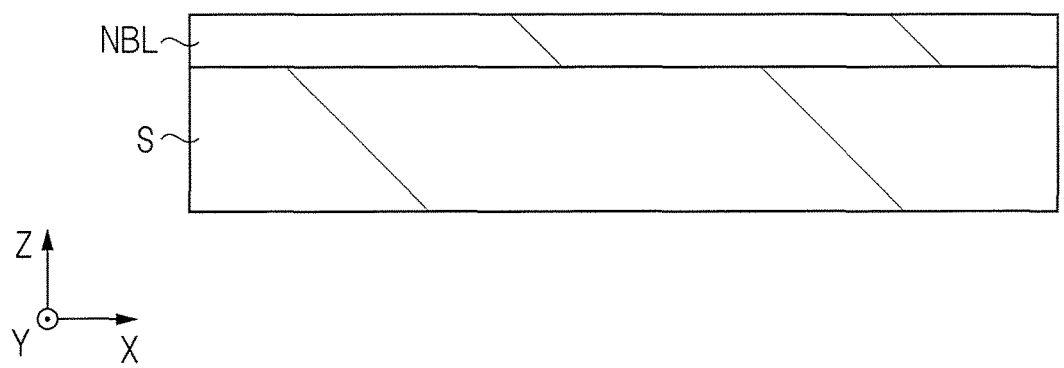
FIG. 15 is a cross-sectional view showing a manufacturing process of the semiconductor device according to the first embodiment.

As shown in FIG. 15, the support substrate S is prepared, and the n type buried region NBL is formed. As the support substrate S, for example, a single crystal silicon substrate can be used. For example, a photoresist film (not illustrated) having an opening for a formation region of the n type buried region NBL is formed on the support substrate S, and an n type impurity is ion-implanted (introduced) into the support substrate S with using the photoresist film as a mask.

Next, as shown in FIG. 16, the p⁻ type epitaxial layer PEP is formed over the support substrate S. For example, a p⁻ type silicon film is epitaxially grown over the support substrate S. In this manner, it is possible to form the semiconductor substrate S1 having the p⁻ type epitaxial layer PEP over the support substrate S. Thereafter, the n type impurity in the n type buried region NBL is activated by performing heat treatment.

Figure 17:
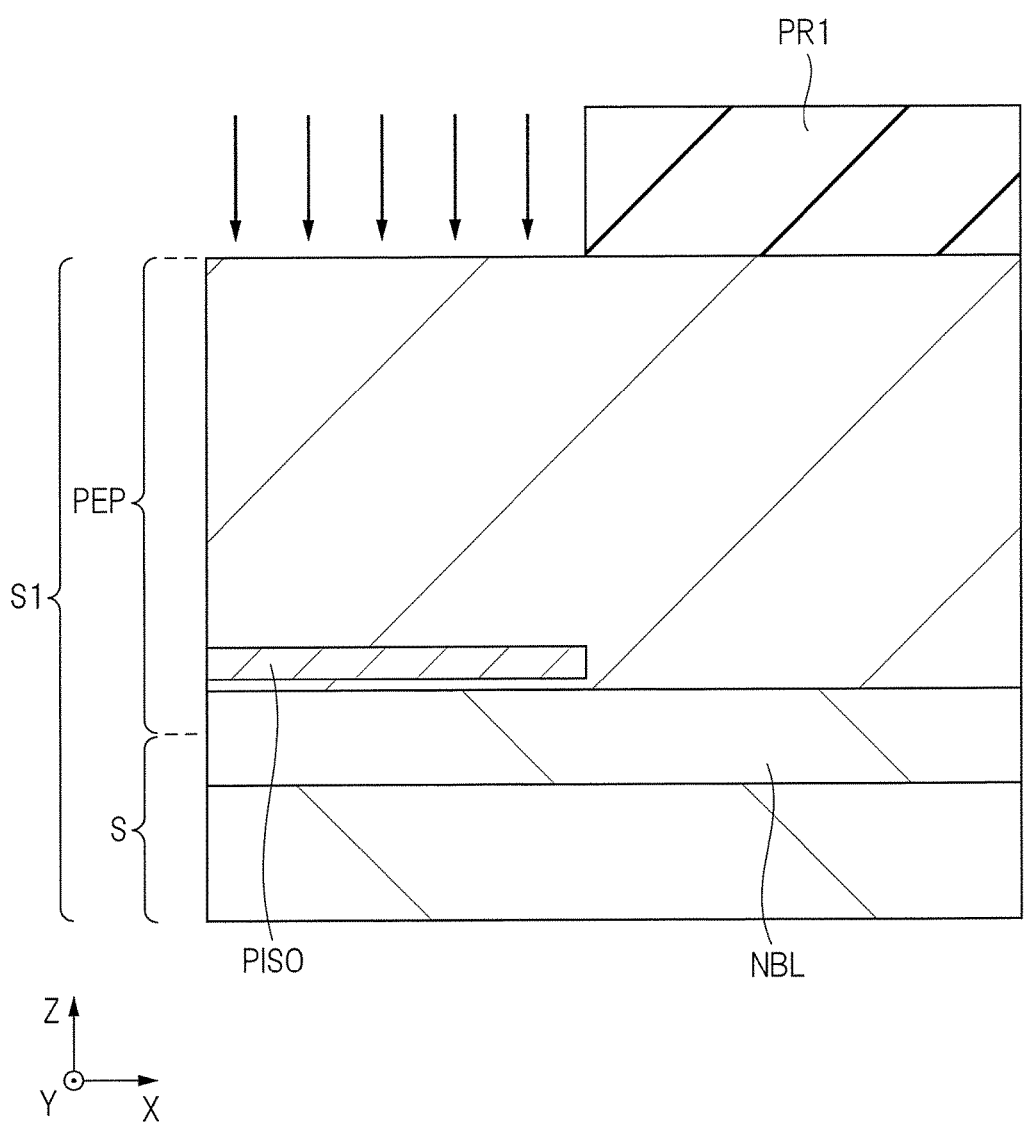
FIG. 17 is a cross-sectional view showing the manufacturing process of the semiconductor device according to the first embodiment.

Next, as shown in FIG. 17, the p type semiconductor region PISO is formed. For example, a p type impurity is ion-implanted into the semiconductor substrate S1 (p⁻ type epitaxial layer PEP) with using a photoresist film PR1 having an opening for a formation region of the p type semiconductor region PISO as a mask. Subsequently, the photoresist film PR1 is removed by ashing or the like.

Figure 18:
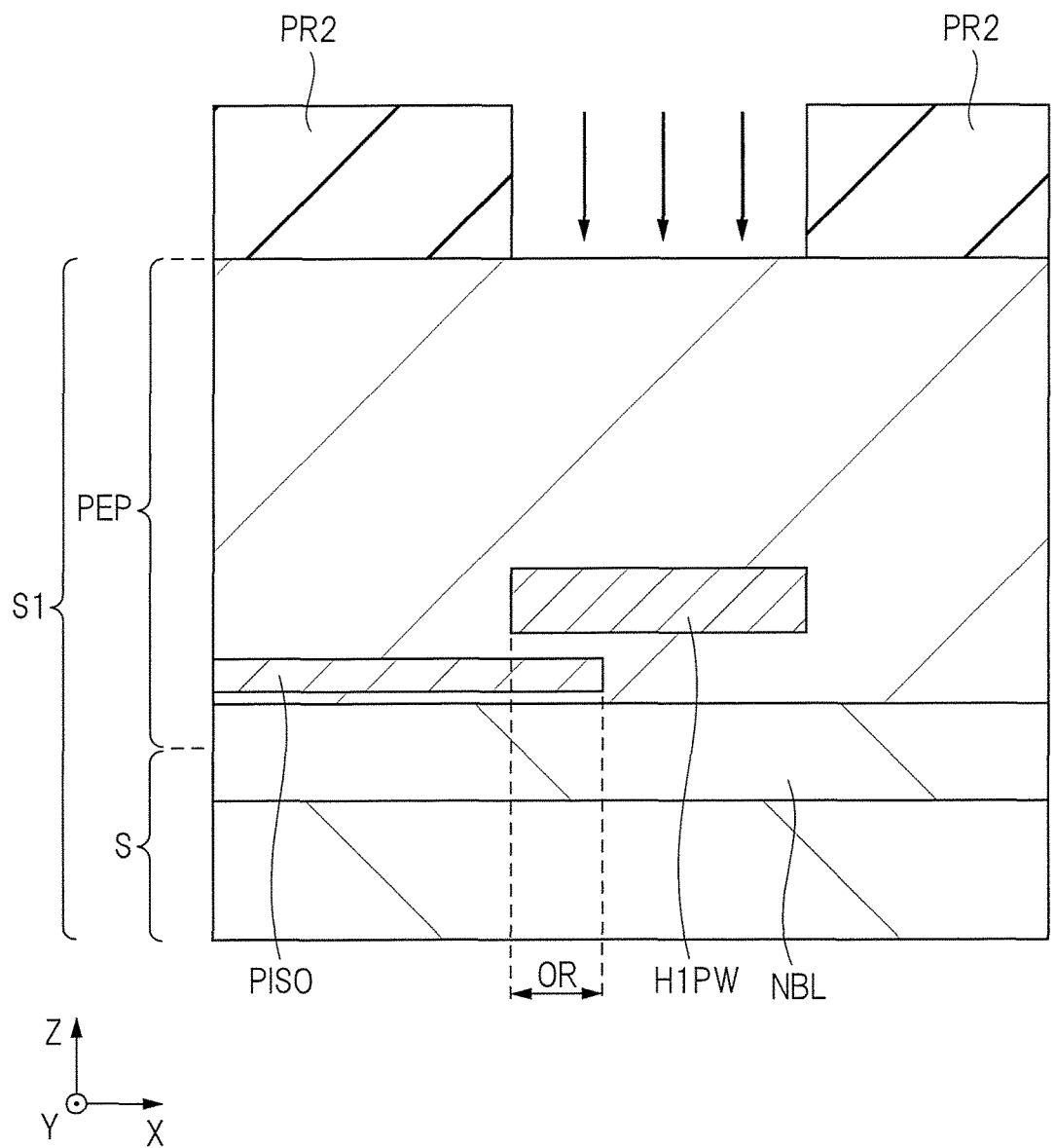
FIG. 18 is a cross-sectional view showing the manufacturing process of the semiconductor device according to the first embodiment.

Next, as shown in FIG. 18, the p type semiconductor region H1PW is formed. For example, a p type impurity is ion-implanted into the semiconductor substrate S1 (p⁻ type epitaxial layer PEP) with using a photoresist film PR2 having an opening for a formation region of the p type semiconductor region H1PW as a mask. Subsequently, the photoresist film PR2 is removed by ashing or the like. The p type semiconductor region H1PW has a p type impurity concentration higher than that of the p type semiconductor region PISO. Also, the semiconductor region H1PW is located at a position shallower than the p type semiconductor region PISO, and is formed so that at least a part (left end part) of the semiconductor region H1PW overlaps the right end part of the p type semiconductor region PISO.

Figure 19:
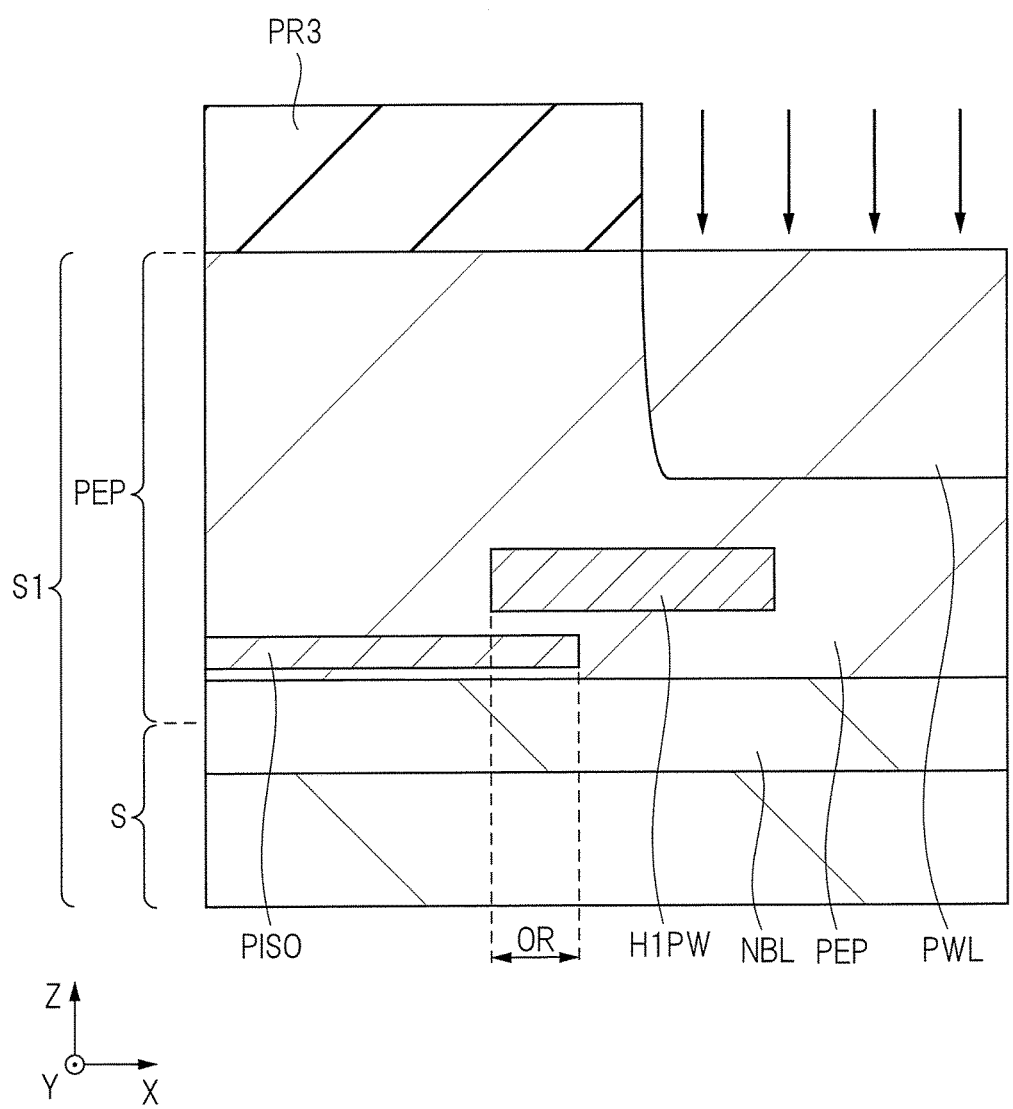
FIG. 19 is a cross-sectional view showing the manufacturing process of the semiconductor device according to the first embodiment.

Next, as shown in FIG. 19, the p type well region PWL is formed. For example, a p type impurity is ion-implanted into the semiconductor substrate S1 (p⁻ type epitaxial layer PEP) with using a photoresist film PR3 having an opening for a formation region of the p type well region PWL as a mask. Subsequently, the photoresist film PR3 is removed by ashing or the like. The p type well region PWL has a p type impurity concentration higher than that of the p type semiconductor region H1PW. Also, a bottom surface of the p type well region PWL is formed at a position shallower than the p type semiconductor region H1PW, and in this case, the right end part of the p type semiconductor region H1PW is formed so as to overlap the left end part of the p type well region PWL.

Figure 20:
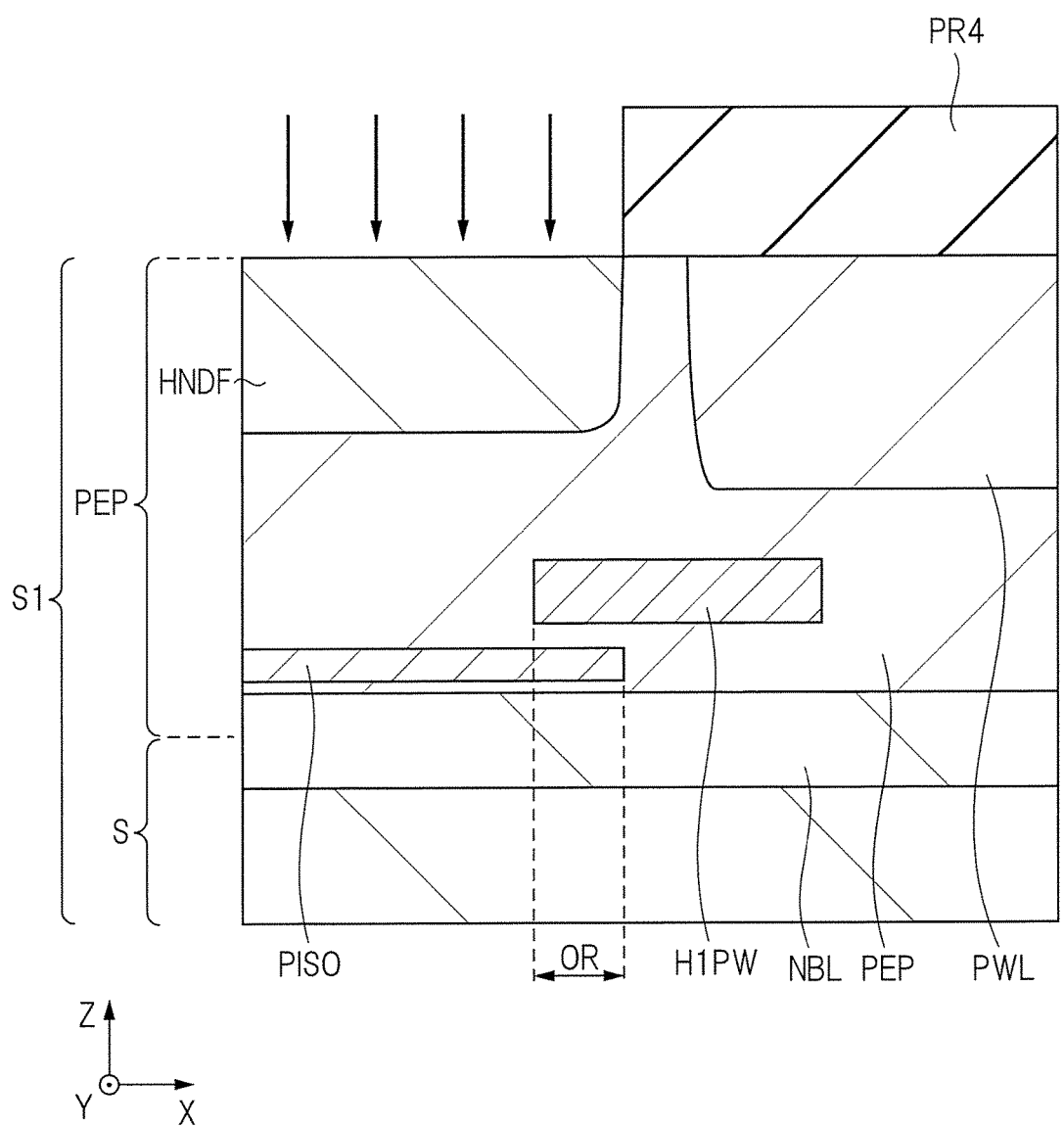
FIG. 20 is a cross-sectional view showing the manufacturing process of the semiconductor device according to the first embodiment.

Next, as shown in FIG. 20, the n type drift region HNDF is formed. For example, the n type drift region HNDF is formed by ion-implanting an n type impurity into the semiconductor substrate S1 (p⁻ type epitaxial layer PEP) with using a photoresist film PR4 having an opening for a formation region of the n type drift region HNDF as a mask. Subsequently, the photoresist film PR4 is removed by ashing or the like. A bottom surface of the n type drift region HNDF is formed at a position shallower than the p type semiconductor region H1PW, and in this case, the right end part of the n type drift region HNDF is formed so as to overlap the left end part of the p type semiconductor region H1PW. In addition, the n type drift region HNDF is formed so as to overlap the p type semiconductor region PISO. It is sufficient if the formation regions of the n type drift region HNDF and the p type semiconductor region PISO overlap each other at least partially, it does not matter if the formation region of p type semiconductor region PISO is narrower than the formation region of the n type drift region HNDF, and it does not matter if the formation region of the p type semiconductor region PISO is wider than the formation region of the n type drift region HNDF.

Figure 21:
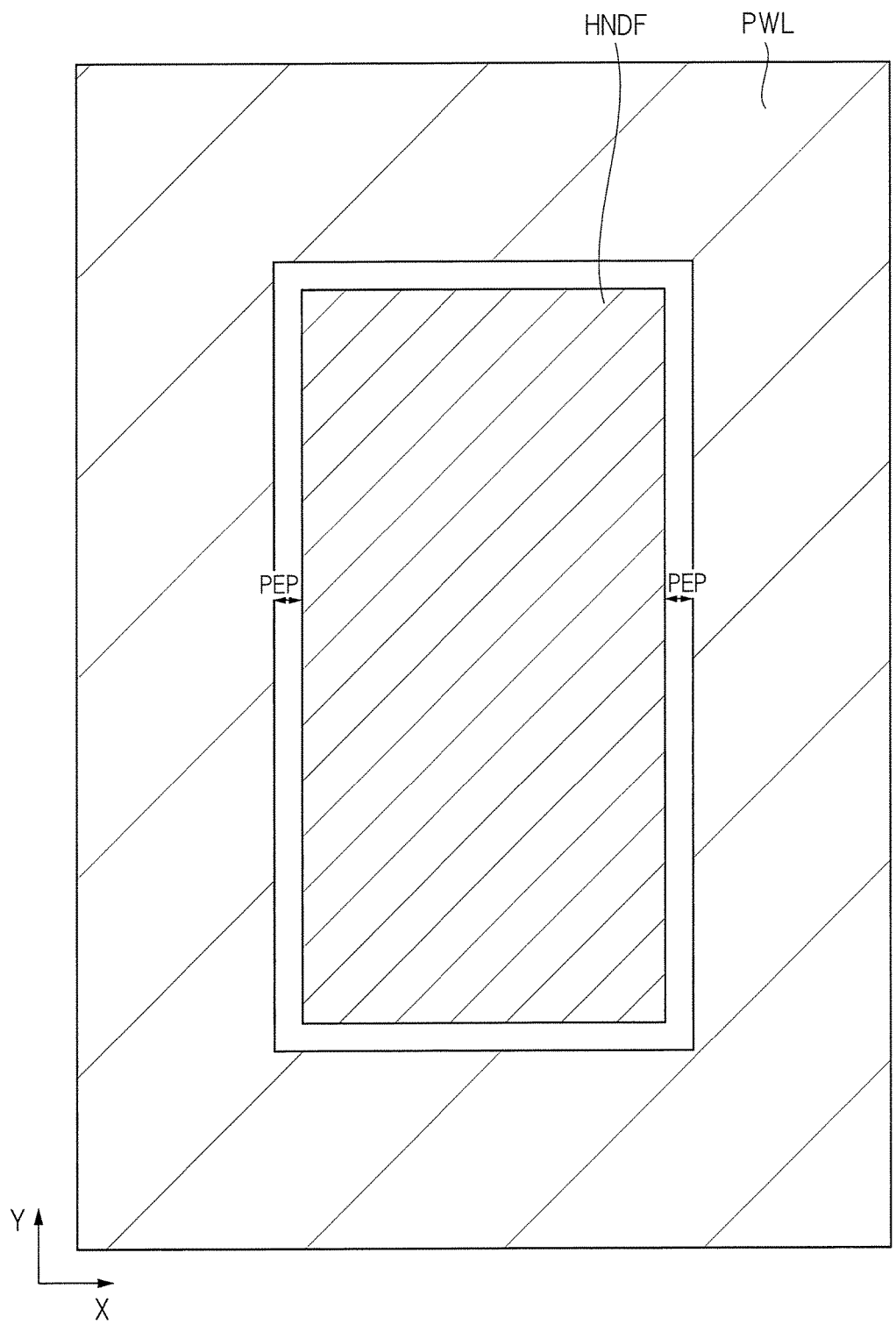
FIG. 21 is a plan view showing the manufacturing process of the semiconductor device according to the first embodiment.

As shown in FIG. 21, the p type well region PWL has an annular rectangular shape and the annular rectangular n type drift region HNDF is formed inside the p type well region PWL in a plan view. In addition, the p type semiconductor region H1PW has an annular rectangular shape and the p type semiconductor region PISO is formed inside the p type semiconductor region H1PW so as to partially overlap the p type semiconductor region H1PW (see FIG. 5). "OR" denotes the overlapping region thereof. Thereafter, heat treatment for activating the ion-implanted impurities is performed.

Figure 22:
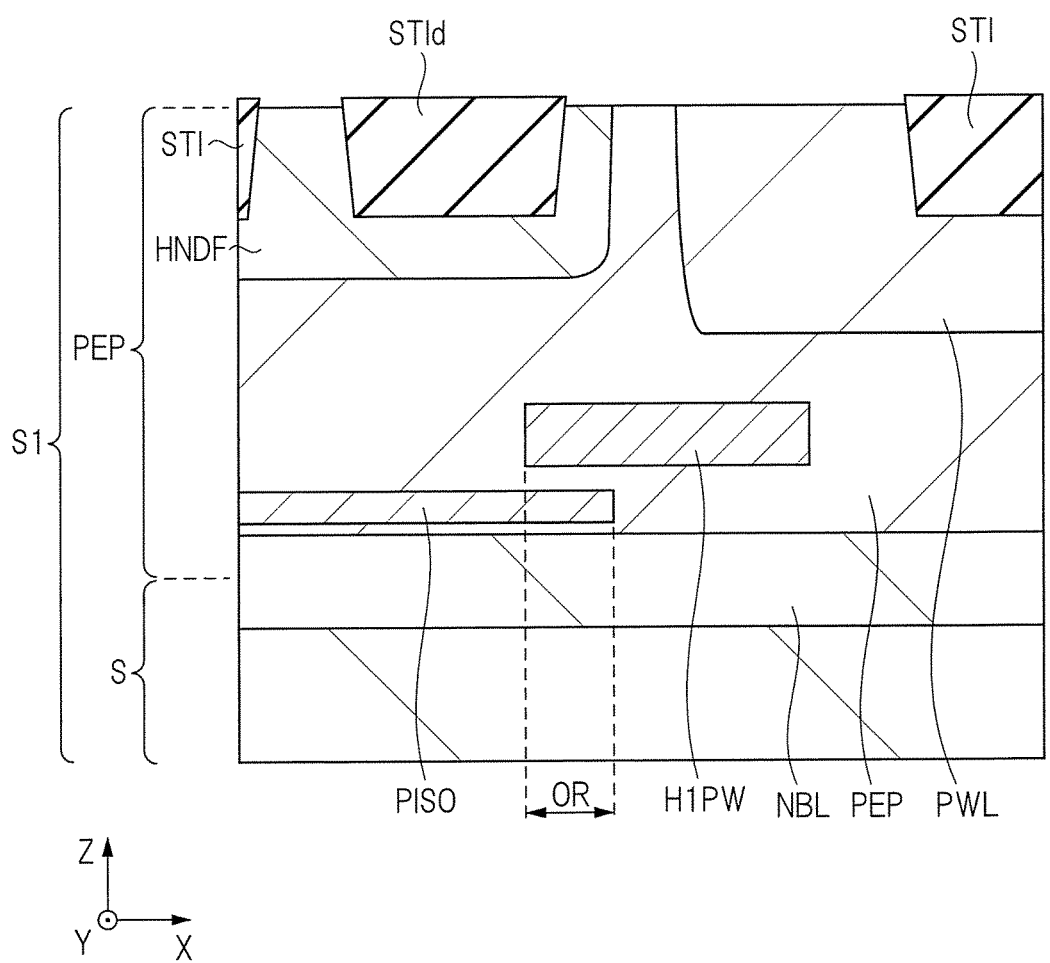
FIG. 22 is a cross-sectional view showing the manufacturing process of the semiconductor device according to the first embodiment.

Next, as shown in FIG. 22, the insulating region STI and the drain insulating region STId are formed. The insulating region STI and the drain insulating region STId can be formed using the shallow trench isolation (STI) method. Note that it is also possible to form the insulating region STI and the drain insulating region STId by the local oxidation of silicon (LOCOS) method.

For example, a trench is formed in the semiconductor substrate S1 (p⁻ type epitaxial layer PEP) by the photolithography technique and the etching technique.

Subsequently, a silicon oxide film having a thickness capable of filling the trench is deposited by the chemical vapor deposition (CVD) method or the like over the semiconductor substrate S1 (p⁻ type epitaxial layer PEP), and the silicon oxide film other than that in the trench is removed using the chemical mechanical polishing (CMP) method or the etch-back method. In this manner, the silicon oxide film can be buried in the trench.

Figure 23:
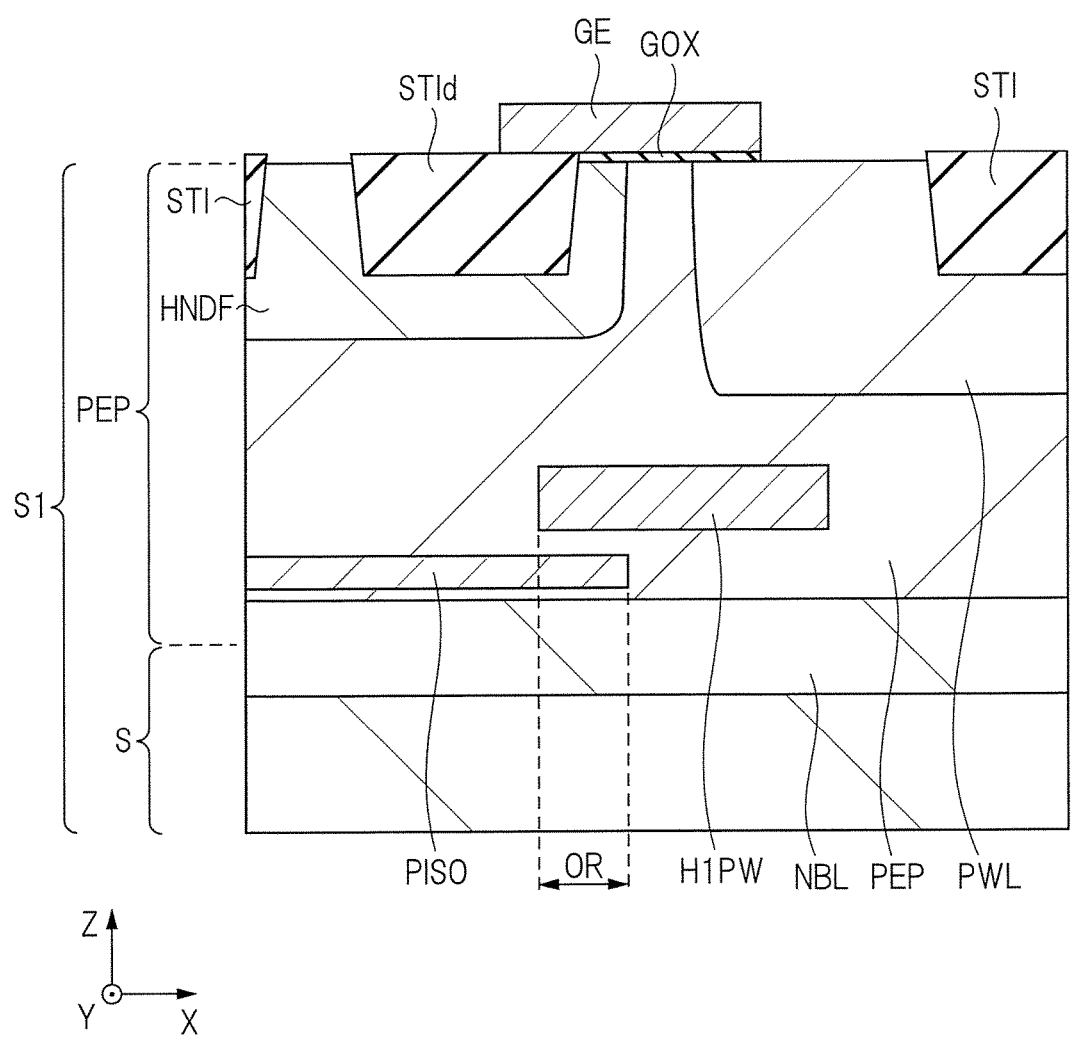
FIG. 23 is a cross-sectional view showing the manufacturing process of the semiconductor device according to the first embodiment.

Next, as shown in FIG. 23, the gate insulating film GOX and the gate electrode GE are formed. For example, the gate insulating film GOX made of a silicon oxide film or the like is formed on the surface of the p⁻ type epitaxial layer PEP by performing the heat treatment (thermal oxidation process) to the semiconductor substrate S1. A film formed by the CVD method may be used as the gate insulating film GOX instead of the thermal oxidation film. Also, a nitride film or a high dielectric constant film (High-k film) may be used other than a silicon oxide film. Subsequently, a polycrystalline silicon film (gate electrode layer) is deposited as a conductive film on the gate insulating film GOX by the CVD method or the like. This polycrystalline silicon film is patterned by the photolithography technique and the dry etching technique. Namely, a photoresist film (not illustrated) is formed on the polycrystalline silicon film (gate electrode layer) and is subjected to exposure and development using the photolithography technique, thereby removing the photoresist film in the region other than the formation region of the gate electrode GE. Subsequently, the polycrystalline silicon film (gate electrode layer) is dry-etched with using the photoresist film as a mask, thereby forming the gate electrode GE. In this etching, the gate insulating film GOX below the polycrystalline silicon film is also etched. Thereafter, the photoresist film is removed by ashing or the like.

In this case, the gate electrode GE of the present embodiment is formed so as to extend from the position above the p type well region PWL over the n type drift region HNDF to the position above the drain insulating region STId.

Figure 24:
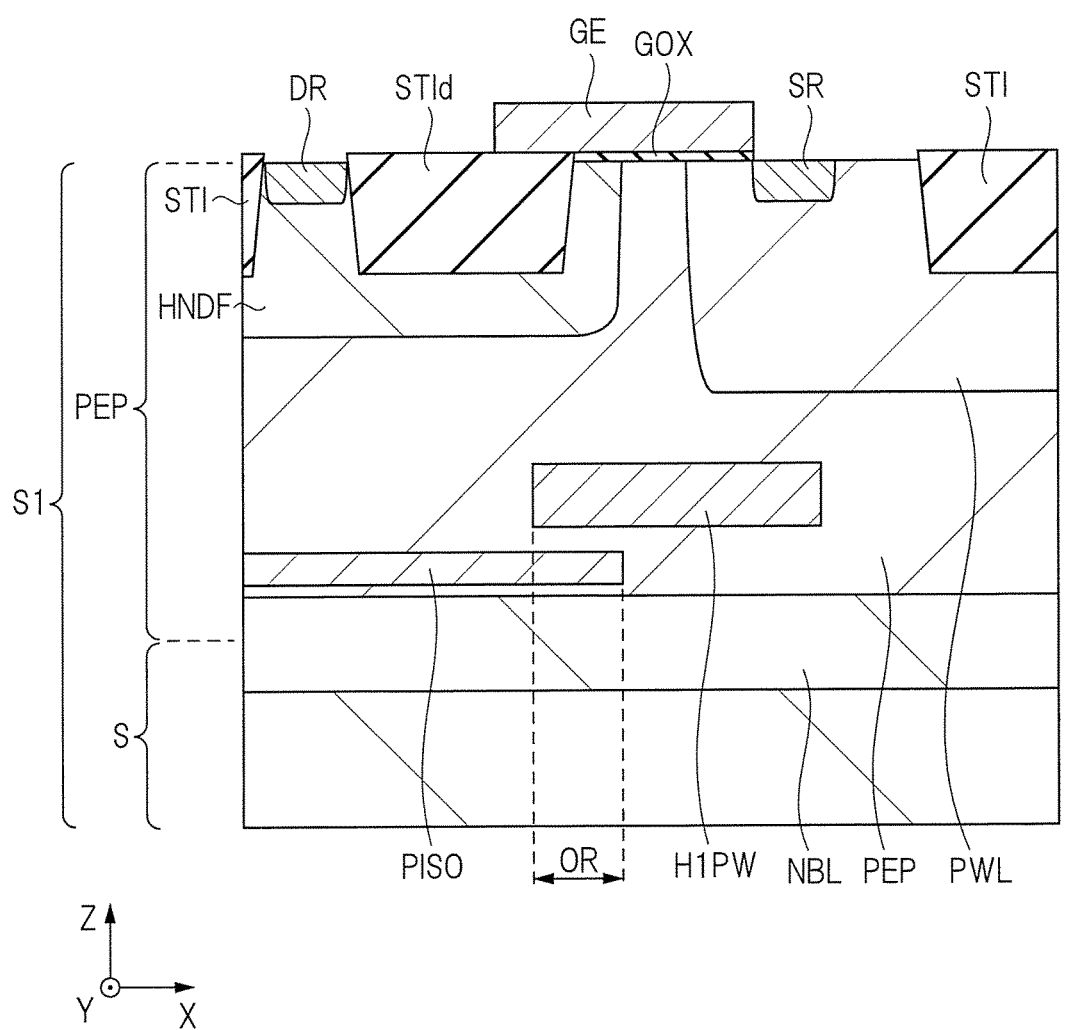
FIG. 24 is a cross-sectional view showing the manufacturing process of the semiconductor device according to the first embodiment.

Next, as shown in FIG. 24, the source region SR and the drain region DR are formed. For example, an n type impurity is ion-implanted into a predetermined region with using a photoresist film (not illustrated) having a predetermined shape as an ion implantation blocking mask. In this case, an n type impurity is ion-implanted into the p type well region PWL on one side (right side in the drawing) of the gate electrode GE, and an n type impurity is ion-implanted into the n type drift region HNDF on the other side (left side in the drawing) of the gate electrode GE.

In this manner, as shown in FIG. 24, the n⁺ type source region SR is formed in a part of the surface of the p type well region PWL, and the n⁺ type drain region DR is formed in a part of the surface of the n type drift region HNDF. The n⁺ type drain region DR is formed in a self-aligned manner with respect to the gate electrode GE.

Figure 25:
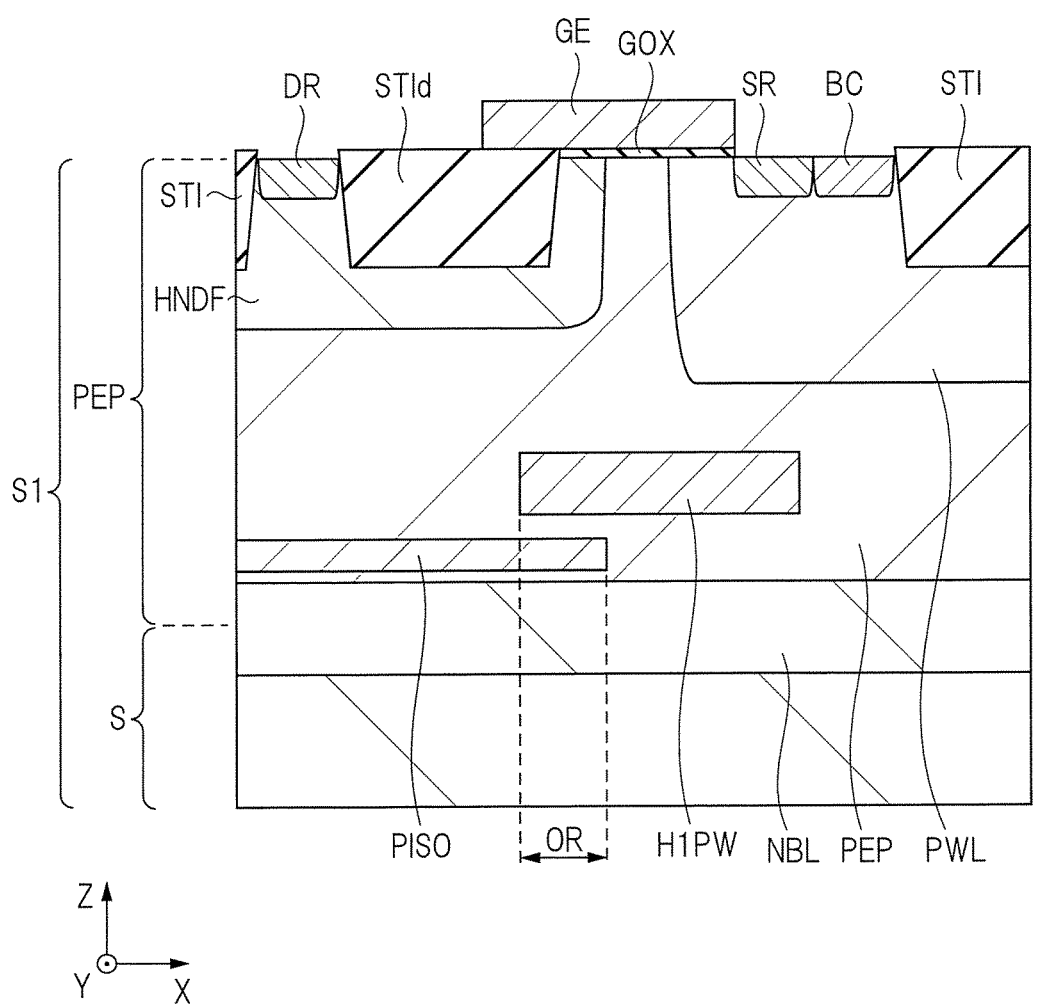
FIG. 25 is a cross-sectional view showing the manufacturing process of the semiconductor device according to the first embodiment.

Next, as shown in FIG. 25, a p type impurity is ion-implanted with using a photoresist film (not illustrated) having a predetermined shape as an ion implantation blocking mask. In this manner, the p⁺ type body contact region BC is formed in the p type well region PWL. Note that the p⁺ type body contact region BC and the n⁺ type source region SR are arranged adjacent to each other and form a pn junction.

Figure 26:
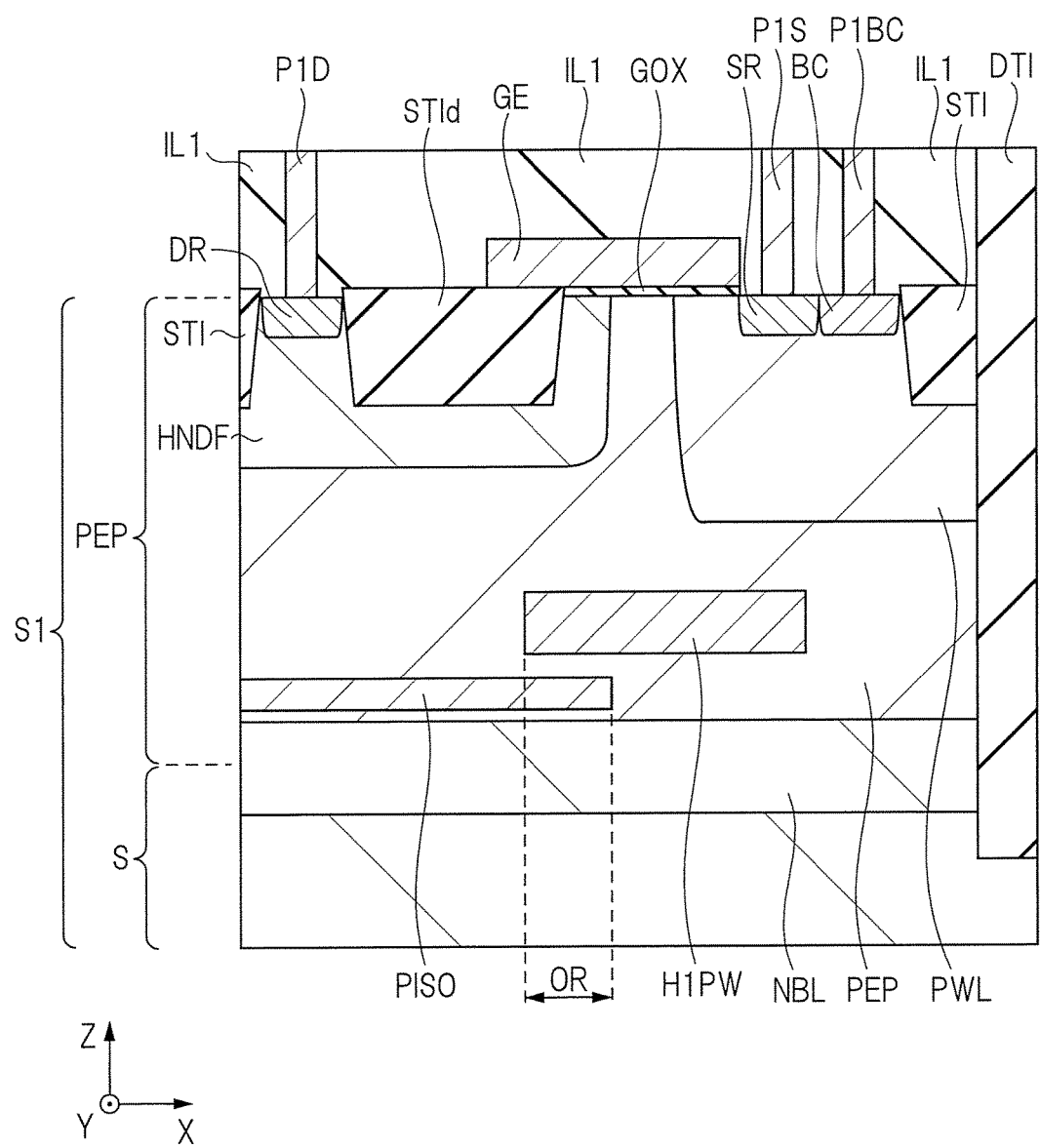
FIG. 26 is a cross-sectional view showing the manufacturing process of the semiconductor device according to the first embodiment.

Next, as shown in FIG. 26, a silicon oxide film or the like is formed as the interlayer insulating film IL1 over the semiconductor substrate S1 (p⁻ type epitaxial layer PEP) by the CVD method or the like. Thereafter, the surface of the interlayer insulating film IL1 is planarized using the CMP method or the like if necessary.

Next, the interlayer insulating film IL1 is dry-etched with using a photoresist film (not illustrated) having a predetermined shape as an etching mask, thereby forming contact holes (through holes) in the interlayer insulating film IL1.

Next, by burying a conductive film in the contact holes, plugs (contact, contact part, connection part, connecting conductive part, connection plug) P1 are formed.

For example, after forming a barrier film such as a titanium nitride film over the interlayer insulating film IL1 including the inside of the contact holes, a tungsten film having a thickness capable of filling the contact holes is deposited on the barrier film, and the unnecessary tungsten film and barrier film on the interlayer insulating film IL1 are removed by the CMP method or the etch-back method. In this manner, the plugs P1 (P1S, P1D, P1BC) can be formed.

Of the plugs P1, the plug formed in the source region SR is referred to as a source plug (source contact part) P1S, the plug formed in the drain region DR is referred to as a drain plug (drain contact part) P1D, and the plug formed in the p$^+$ type body contact region BC is referred to as a body contact plug (body contact part) P1BC.

Next, the deep insulating region DTI is formed. The deep insulating region DTI can be formed by the STI method. For example, a deep trench is formed in the semiconductor substrate S1 and the interlayer insulating film IL1 by the photolithography technique and the etching technique. The bottom part of the trench is located at a position deeper than the p type semiconductor region PISO, for example. In this case, the bottom part of the trench reaches the support substrate S below the p$^-$ type epitaxial layer PEP.

Next, a silicon oxide film having a thickness capable of filling the trench is deposited by the CVD method or the like over the interlayer insulating film IL1, and the silicon oxide film other than that in the trench is removed using the chemical mechanical polishing method or the etch-back method. In this manner, the silicon oxide film can be buried in the deep trench.

Next, a conductive film is deposited over the interlayer insulating film IL1 and is then patterned by the photolithography technique and the etching technique, thereby forming the wiring M1 (see FIG. 1).

Note that, in the manufacturing process described above, the p type semiconductor region PISO is formed in the p$^-$ type epitaxial layer PEP, but it may be formed in the support substrate S. In addition, the p type well region PWL and the n type drift region HNDF may be formed by the ion implantation method after forming the drain insulating region STId. Furthermore, the order of the ion implantation processes for forming the p type semiconductor region H1PW, the p type semiconductor region PISO, the p type well region PWL and the n type drift region HNDF may be changed as appropriate.

(Second Embodiment)

In the present embodiment, application examples of the first embodiment (FIG. 1) will be described. In particular, layout examples of the p type semiconductor region H1PW and the p type semiconductor region PISO will be described.

(First Application Example)

FIG. 27 is a cross-sectional view showing a structure of a semiconductor device of a first application example according to the present embodiment. Although a region in which the p type semiconductor region PISO is not formed is present below the p type well region PWL in the first embodiment (FIG. 1), the p type semiconductor region PISO may be formed so as to reach the deep insulating region DTI through a position below the p type well region PWL. In other words, the p type semiconductor region PISO may be provided over the entire region surrounded by the deep insulating region DTI. Since the structure other than the p type semiconductor region PISO is the same as that of the first embodiment (FIG. 1), the description thereof is omitted.

In this application example, as described in the first embodiment in detail, the negative input breakdown voltage can be ensured by providing the p type semiconductor region PISO, and the on-breakdown voltage can be improved by providing the p type semiconductor region H1PW. The effect of improving the on-breakdown voltage like this is apparent from the comparison between FIG. 12A and FIG. 12B and between FIG. 13A and FIG. 13B described in the first embodiment. However, as is apparent from the comparison between FIG. 14A and FIG. 14B, the potential difference between the p type semiconductor region PISO and the p type well region PWL is larger in the first embodiment shown in FIG. 14B than in the first application example shown in FIG. 14A, and the hole extraction effect is greater in the first embodiment.

(Second Application Example)

Figure 28:
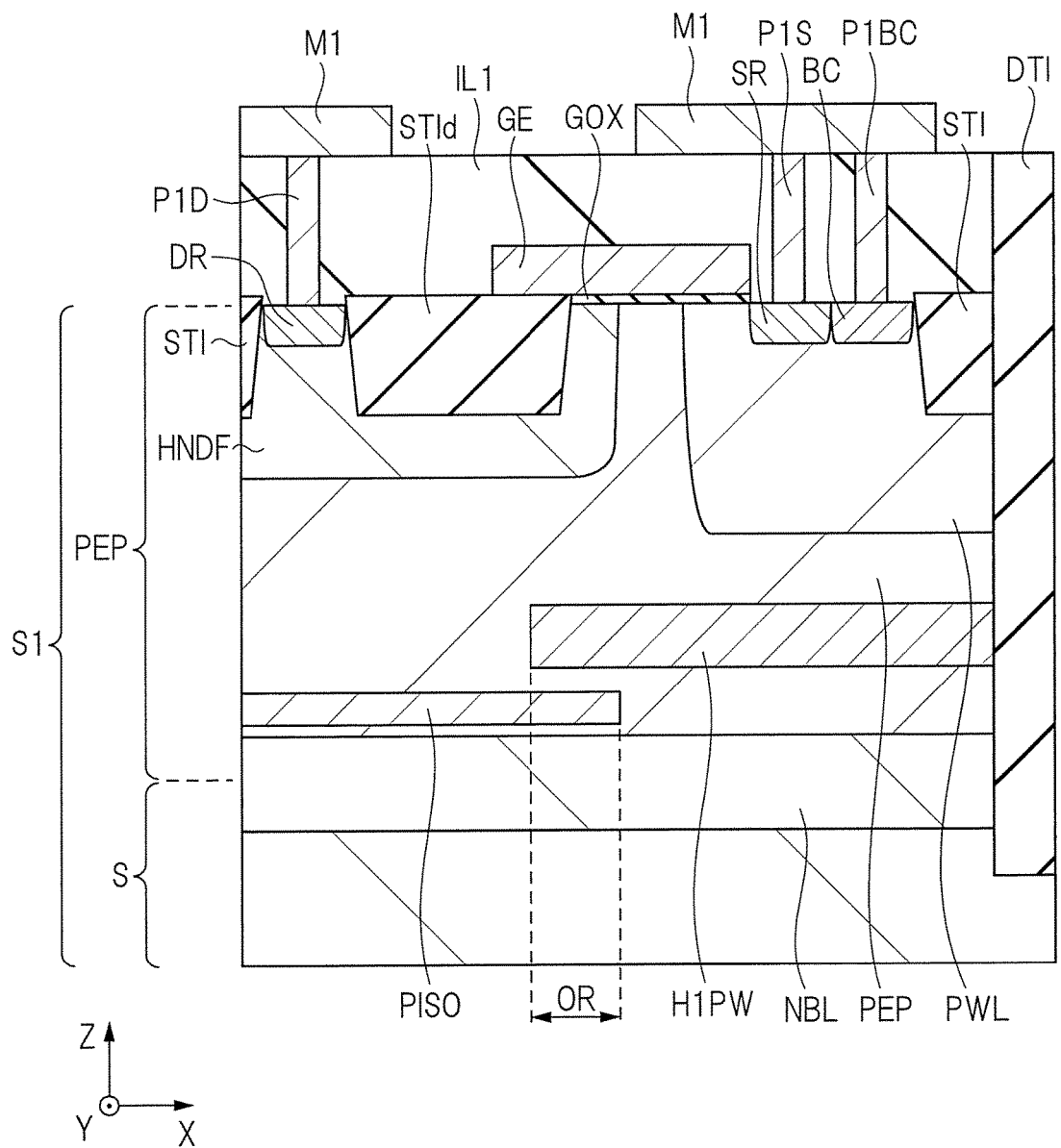
FIG. 28 is a cross-sectional view showing a structure of a semiconductor device of a second application example according to the second embodiment.

FIG. 28 is a cross-sectional view showing a structure of a semiconductor device of a second application example according to the present embodiment. Although a region in which the p type semiconductor region H1PW is not formed is present below the p type well region PWL in the first embodiment (FIG. 1), the p type semiconductor region H1PW may be formed so as to reach the deep insulating region DTI through a position below the p type well region PWL. In other words, the right end part of the p type semiconductor region H1PW is arranged below the p type well region PWL in the first embodiment (FIG. 1), but the right end part of the p type semiconductor region H1PW may be arranged so as to be in contact with the deep insulating region DTI. Since the structure other than the p type semiconductor region H1PW is the same as that of the first embodiment (FIG. 1), the description thereof is omitted. No characteristic problems occur even when the right end part of the p type semiconductor region H1PW is brought into contact with the deep insulating region DTI and the formation region of the p type semiconductor region H1PW is increased toward the right side of the drawing as described above.

(Third Application Example)

Figure 29:
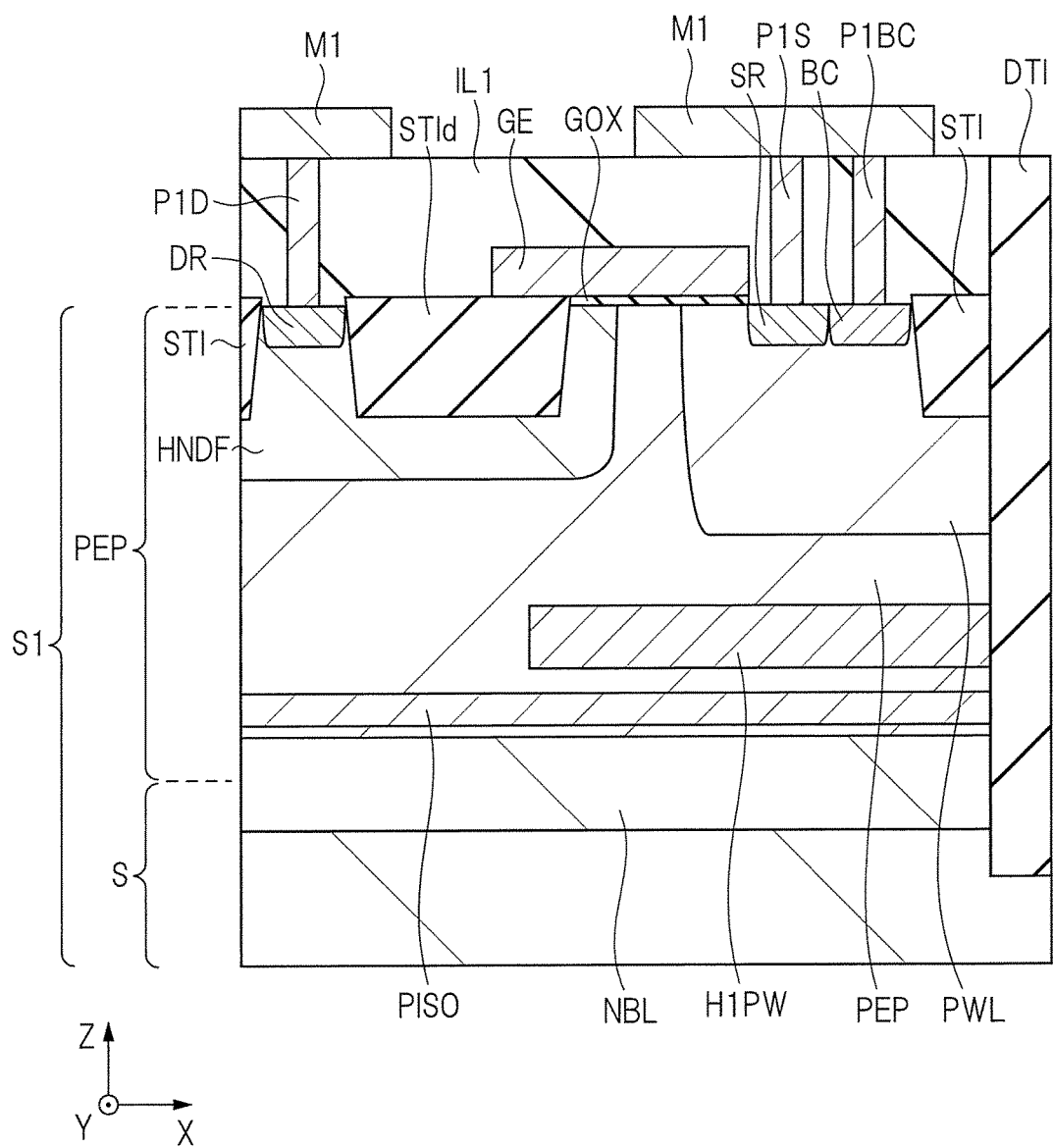
FIG. 29 is a cross-sectional view showing a structure of a semiconductor device of a third application example according to the second embodiment.

FIG. 29 is a cross-sectional view showing a structure of a semiconductor device of a third application example according to the present embodiment. In this application example, the p type semiconductor region PISO of the first application example and the p type semiconductor region H1PW of the second application example are combined. Also in this application example, the negative input breakdown voltage can be ensured by providing the p type semiconductor region PISO, and the on-breakdown voltage can be improved by providing the p type semiconductor region H1PW.

(Fourth Application Example)

Figure 30:
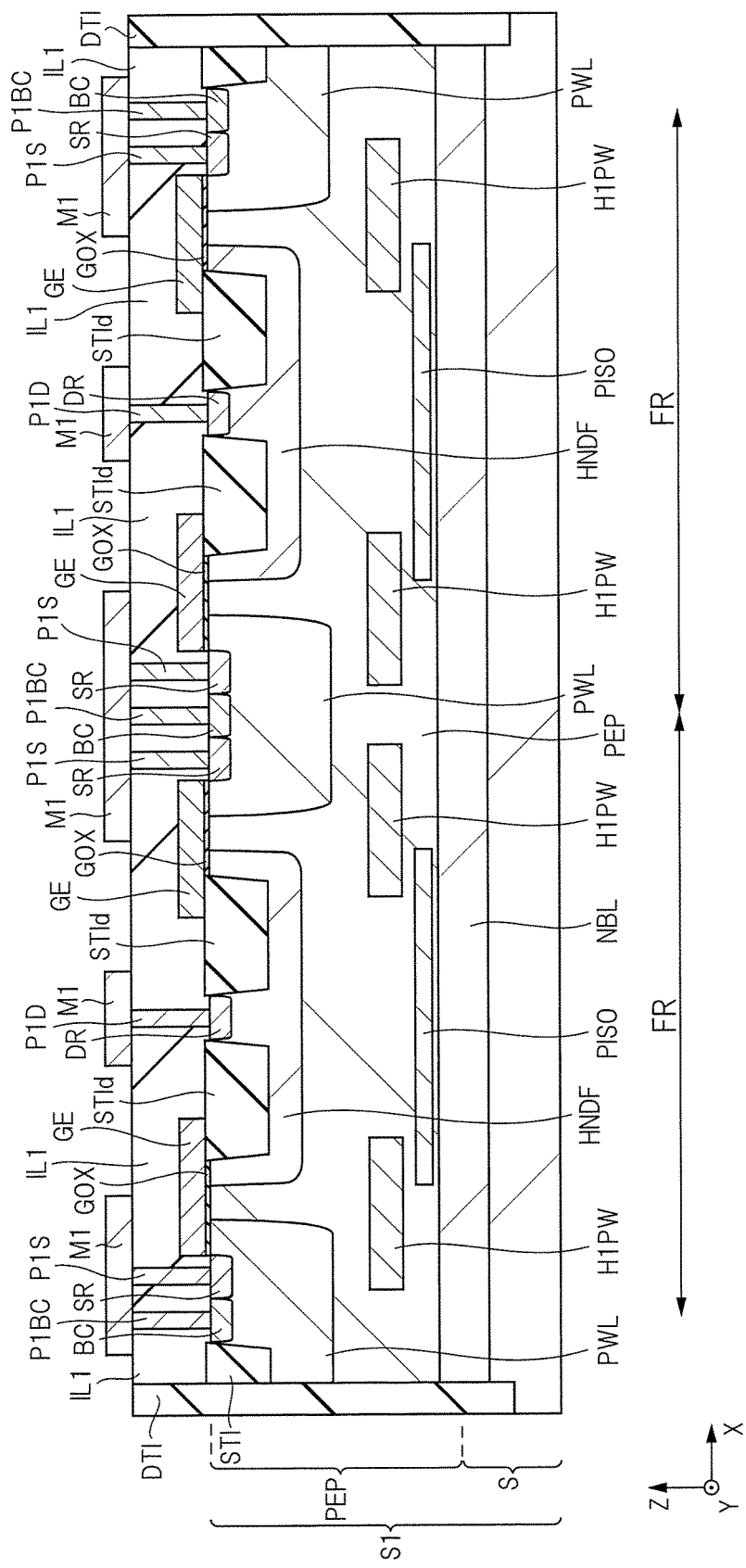
FIG. 30 is a cross-sectional view showing a structure of a semiconductor device of a fourth application example according to the second embodiment.

FIG. 30 is a cross-sectional view showing a structure of a semiconductor device of a fourth application example according to the present embodiment. The semiconductor device shown in the cross-sectional view of FIG. 30 is the LDMOS in which two finger regions FR each having respective constituent parts described in the first embodiment (FIG. 1) arranged to be symmetrical with respect to the drain region DR are disposed.

(Fifth Application Example)

Figure 31:
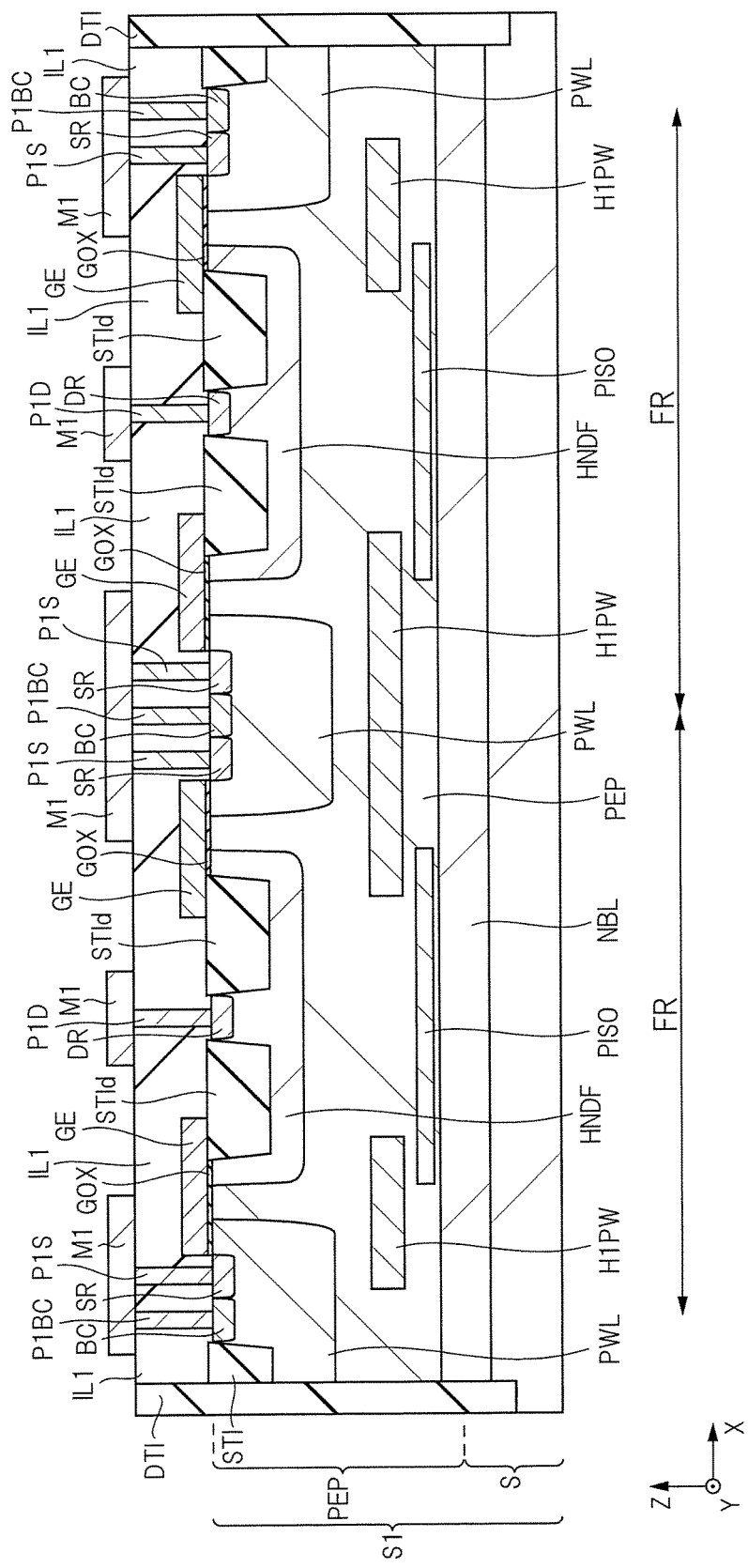
FIG. 31 is a cross-sectional view showing a structure of a semiconductor device of a fifth application example according to the second embodiment.

FIG. 31 is a cross-sectional view showing a structure of a semiconductor device of a fifth application example according to the present embodiment. In the semiconductor device shown in FIG. 31, the separated p type semiconductor regions H1PW of FIG. 30 are connected at the boundary between the finger regions FR.

(Third Embodiment)

The application of the semiconductor device (LDMOS) described in the first and second embodiments is not particularly limited, and the semiconductor device can be incorporated in, for example, the semiconductor chip described below.

Figure 32:
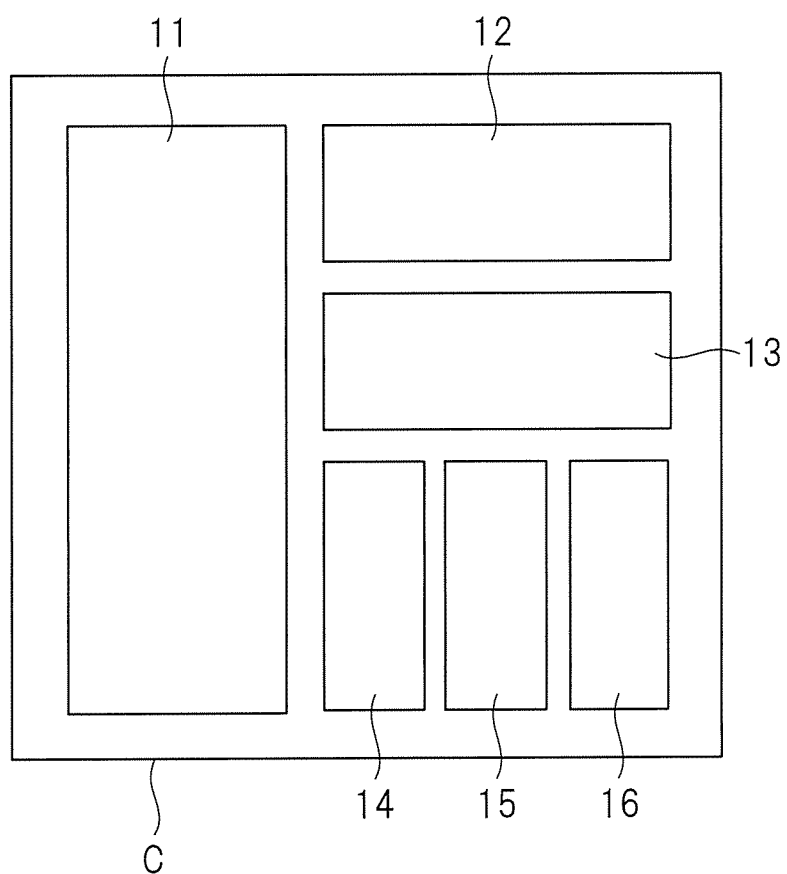
FIG. 32 is a plan view showing a semiconductor chip of a BiC-DMOS.

FIG. 32 is a plan view showing a semiconductor chip of a bipolar complementary double-diffused metal oxide semiconductor (BiC-DMOS). A semiconductor chip C shown in FIG. 32 includes a driver circuit unit 11, a pre-driver circuit unit 12, an analog circuit unit 13, a power supply circuit unit 14, a logic circuit unit 15, an input/output circuit unit 16 and others. Among them, for example, the logic circuit unit 15 is constituted of a low breakdown voltage complementary MOS (CMOS) transistor. In addition, the driver circuit unit 11 is constituted of a high breakdown voltage element such as LDMOS.

For example, in the logic circuit unit 15 mentioned above, the formation region thereof is surrounded by the deep insulating region DTI in a plan view. In addition, in the driver circuit unit 11, the formation region of each element is surrounded by the deep insulating region DTI in a plan view.

For example, the semiconductor device (LDMOS) described in the first and second embodiments can be applied to the driver circuit unit 11 mentioned above. In particular, when the semiconductor device (LDMOS) having large gate width and large finger count is incorporated into the driver circuit unit 11, the semiconductor device (LDMOS) described in the first and second embodiments can be preferably used.

In the foregoing, the invention made by the inventor of the present invention has been concretely described based on the embodiments. However, it is needless to say that the present invention is not limited to the foregoing embodiments and various modifications and alterations can be made within the scope of the present invention.

For example, in the description of the semiconductor device (LDMOS) according to the first embodiment (FIG. 1) and others, the n channel LDMOS has been taken as an example. Alternatively, the present invention may be applied to a p channel LDMOS by changing the conductivity type of the p type semiconductor region PISO and the p type semiconductor region H1PW to an n type.

What is claimed is:
1. A semiconductor device comprising:
a semiconductor layer;
a source region and a drain region of a first conductivity type formed separately from each other in the semiconductor layer;
a channel formation region located between the source region and the drain region;
a first insulating region formed in the semiconductor layer between the channel formation region and the drain region;
a gate electrode formed via a gate insulating film on the channel formation region and extending to a position above the first insulating region;
a first semiconductor region of the first conductivity type surrounding the drain region;
a second semiconductor region of a second conductivity type opposite to the first conductivity type surrounding the source region;
a third semiconductor region of the second conductivity type arranged underneath the first semiconductor region such that the third semiconductor region overlaps with the first semiconductor region in plan view; and
a fourth semiconductor region of the second conductivity type arranged between the third semiconductor region and the second semiconductor region,
wherein the fourth semiconductor region has a first end part and a second end part opposite the first end part,
wherein the fourth semiconductor region is arranged such that the first end part overlaps, in plan view, with respective end parts of the third semiconductor region and the first semiconductor region that are closest to the second semiconductor region,
wherein the fourth semiconductor region is arranged such that the second end part overlaps, in plan view, with the second semiconductor region, and
wherein the third semiconductor region does not overlap with the second semiconductor region in plan view.
2. The semiconductor device according to claim 1,
wherein an impurity concentration of the second conductivity type of the second semiconductor region is higher than an impurity concentration of the second conductivity type of the fourth semiconductor region, and
the impurity concentration of the second conductivity type of the fourth semiconductor region is higher than an impurity concentration of the second conductivity type of the third semiconductor region.
3. The semiconductor device according to claim 2,
wherein an impurity concentration of the first conductivity type of the drain region is higher than an impurity concentration of the first conductivity type of the first semiconductor region.
4. The semiconductor device according to claim 1, further comprising:
a fifth semiconductor region of the first conductivity type below the third semiconductor region.
5. The semiconductor device according to claim 1, further comprising:
a second insulating region which is arranged to be in contact with the second semiconductor region and has a bottom surface at a position deeper than a bottom surface of the first insulating region.
6. The semiconductor device according to claim 5,
wherein the drain region has a rectangular shape in plan view,
wherein the source region has an annular rectangular shape that surrounds the drain region in plan view, and
wherein the drain region and the source region are part of a cell region.
7. The semiconductor device according to claim 6,
wherein a plurality of the cell regions are provided, and the second insulating region surrounds the plurality of cell regions.
8. The semiconductor device according to claim 5, wherein the second end part of the fourth semiconductor region contacts the second insulating region.
9. The semiconductor device according to claim 5, wherein an end part of the third semiconductor region contacts the second insulating region.
10. The semiconductor device according to claim 1,
wherein the first end part of the fourth semiconductor region is located between a first position, which is spaced from the drain region by one-third of a width of the first insulating region, and a second position that coincides with an end part of the second semiconductor region closest to the first insulating region.
11. The semiconductor device according to claim 1,
wherein the second end part of the fourth semiconductor region is located in a region extending from an end part of the second semiconductor region closest to the first insulating region toward the source region.

12. The semiconductor device according to claim 1, wherein the first conductivity type is an n type and the second conductivity type is a p type.

13. The semiconductor device according to claim 1, wherein the fourth semiconductor region does not overlap with the drain region in plan view.

14. The semiconductor device according to claim 1, wherein the second end part of the fourth semiconductor region overlaps with the source region in plan view.

15. The semiconductor device according to claim 1, wherein, in plan view, the first semiconductor region is separated from the second semiconductor region by a portion of the semiconductor layer.

16. The semiconductor device according to claim 1, wherein, in cross-sectional view, the first end part of the fourth semiconductor region is separated from an overlapping portion of the third semiconductor region by an intervening portion of the semiconductor layer.

17. The semiconductor device according to claim 16, wherein an impurity concentration of the second conductivity type of the semiconductor layer is less than that of the third and fourth semiconductor regions.

18. The semiconductor device according to claim 1, wherein, in plan view:
the third semiconductor region has a rectangular shape,
the fourth semiconductor region has an annular rectangular shape,
the first end part is an innermost portion of the annular rectangular shape that overlaps with the third semiconductor region, and
the second end part is an outermost portion of the annular rectangular shape that surrounds the third semiconductor region.

19. The semiconductor device according to claim 18, wherein the second end part overlaps with an end part of the second semiconductor region closest to the first semiconductor region in plan view.

* * * * *